(12) United States Patent
Hosoda et al.

(10) Patent No.: US 11,011,506 B2
(45) Date of Patent: *May 18, 2021

(54) BONDED STRUCTURE INCLUDING A PERFORMANCE-OPTIMIZED SUPPORT CHIP AND A STRESS-OPTIMIZED THREE-DIMENSIONAL MEMORY CHIP AND METHOD FOR MAKING THE SAME

(71) Applicant: SANDISK TECHNOLOGIES LLC, Addison, TX (US)

(72) Inventors: Naohiro Hosoda, Yokkaichi (JP); Kazuma Shimamoto, Yokkaichi (JP); Tetsuya Shirasu, Yokkaichi (JP); Yuji Fukano, Yokkaichi (JP); Akio Nishida, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/847,857

(22) Filed: Apr. 14, 2020

(65) Prior Publication Data
US 2020/0258876 A1 Aug. 13, 2020

Related U.S. Application Data

(63) Continuation of application No. 16/242,216, filed on Jan. 8, 2019, now Pat. No. 10,665,580.

(51) Int. Cl.
*H01L 25/18* (2006.01)
*H01L 27/11582* (2017.01)
(Continued)

(52) U.S. Cl.
CPC .............. *H01L 25/18* (2013.01); *G11C 16/08* (2013.01); *G11C 16/24* (2013.01); *G11C 16/26* (2013.01);
(Continued)

(58) Field of Classification Search
CPC .................................................... H01L 25/18
See application file for complete search history.

(56) References Cited

U.S. PATENT DOCUMENTS 5,915,167 A 6/1999 Leedy
10,665,580 B1 * 5/2020 Hosoda ............... H01L 25/18
(Continued)

OTHER PUBLICATIONS

U.S. Appl. No. 15/873,101, filed Jan. 17, 2018, SanDisk Technologies LLC.
(Continued)

*Primary Examiner* — Daniel P Shook
(74) *Attorney, Agent, or Firm* — The Marbury Law Group PLLC

(57) ABSTRACT

A bonded assembly includes a memory die including a three-dimensional memory array located on a first single crystalline semiconductor substrate, and a logic die including a peripheral circuitry located on a second single crystalline semiconductor substrate and bonded to the memory die. The three-dimensional memory array includes word lines and bit lines. The logic die includes field effect transistors having semiconductor channels configured to flow electrical current along a channel direction that is parallel to the bit lines or word lines. Different crystallographic orientations are used for the first and second single crystalline semiconductor substrates. The crystallographic orientations of the first single crystalline semiconductor substrate are selected to minimize stress deformation of the memory chip, while the crystallographic orientations of the second single crystalline semiconductor substrate are selected to maximize device performance of the peripheral circuitry.

12 Claims, 33 Drawing Sheets

(51) Int. Cl.

| | | |
|---|---|---|
| G11C 16/24 | (2006.01) | |
| G11C 16/08 | (2006.01) | |
| G11C 16/26 | (2006.01) | |
| H01L 27/11519 | (2017.01) | |
| H01L 27/11573 | (2017.01) | |
| H01L 27/11556 | (2017.01) | |
| H01L 27/11529 | (2017.01) | |
| H01L 27/11565 | (2017.01) | |
| H01L 27/1157 | (2017.01) | |
| H01L 27/11524 | (2017.01) | |

(52) U.S. Cl.
CPC .... *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01)

(56) References Cited

U.S. PATENT DOCUMENTS

| | | |
|---|---|---|
| 2014/0061750 A1 | 3/2014 | Kwon et al. |
| 2015/0162343 A1 | 3/2015 | Park et al. |
| 2015/0348987 A1 | 12/2015 | Lee et al. |
| 2016/0079164 A1 | 3/2016 | Fukuzumi et al. |
| 2017/0040338 A1 | 2/2017 | Lee et al. |

OTHER PUBLICATIONS

U.S. Appl. No. 15/892,648, filed Feb. 9, 2018, SanDisk Technologies LLC.
U.S. Appl. No. 15/928,340, filed Mar. 22, 2018, SanDisk Technologies LLC.
U.S. Appl. No. 15/928,407, filed Mar. 22, 2018, SanDisk Technologies LLC.
U.S. Appl. No. 15/960,267, filed Apr. 23, 2018, SanDisk Technologies LLC.
U.S. Appl. No. 15/979,885, filed May 15, 2018, SanDisk Technologies LLC.
U.S. Appl. No. 16/231,752, filed Dec. 24, 2018, SanDisk Technologies LLC.
Endoh, T. et al., "Novel Ultra High Density Memory with a Stacked-Surrounding Gate Transistor (S-SGT) Structured Cell," IEDM Proc., (2001), 33-36.
Ohmi, T. et al., "Science-based New Silicon Technologies Exhibiting Super High Performance due to Radical-reaction-based Semiconductor Manufacturing", Journal of the Korean Physical Society, vol. 59, No. 2, Aug. 2011, pp. 391-401.
Chang, L. et al., "CMOS Circuit Performance Enhancement by Surface Orientation Optimization", IEEE Transactions on Electron Devices, vol. 51, No. 10, Oct. 2004. (Abstract Only).
Yang, M. et al., "Performance Dependence of CMOS on Silicon Substrate Orientation for Ultrathin Oxynitride and HfO2 Gate Dielectrics", IEEE Electron Device Letters, vol. 24, No. 5, May 2003.
Hopcroft, M. A. et al., "What is the Young's Modulus of Silicon?", IEEE Journal of Microelectromechanical Systems, vol. 19, Issue 2, pp. 229-238, 2010.
Saito, S. et al., "Origin of Drivability Enhancement in Scaled pMOSFETs with 45○ Rotated <100> channels", 2006 Symposium on VLSI Technology. Jun. 2006. (Abstract Only) Available at https://ieeexplore.ieee.org/document/1705261, visited Jan. 7, 2019.
Notification of Transmittal of the International Search Report and Written Opinion of the International Search Authority for International Patent Application No. PCT/US2019/062741, dated Mar. 17, 2020, 10 pages.

* cited by examiner

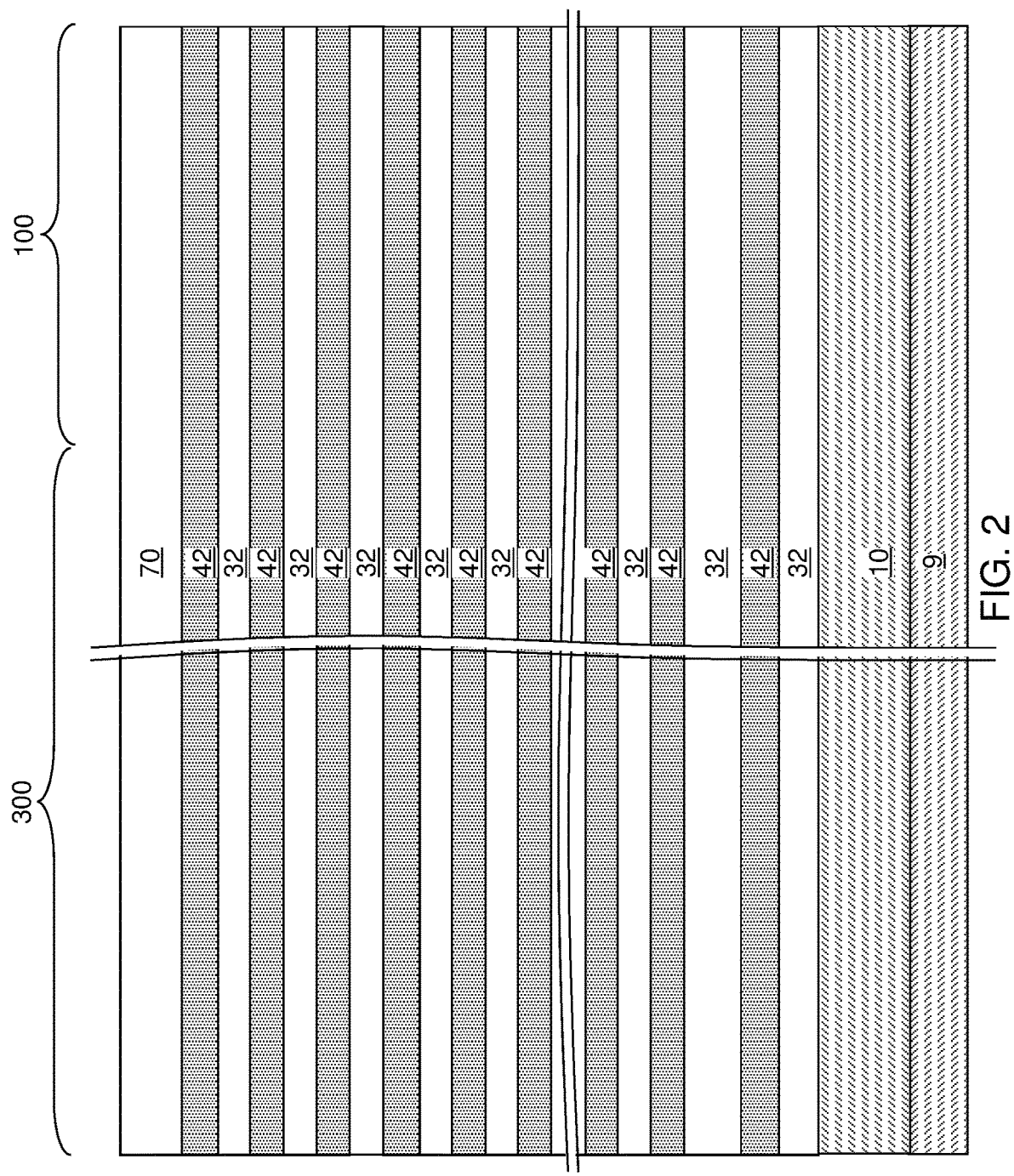

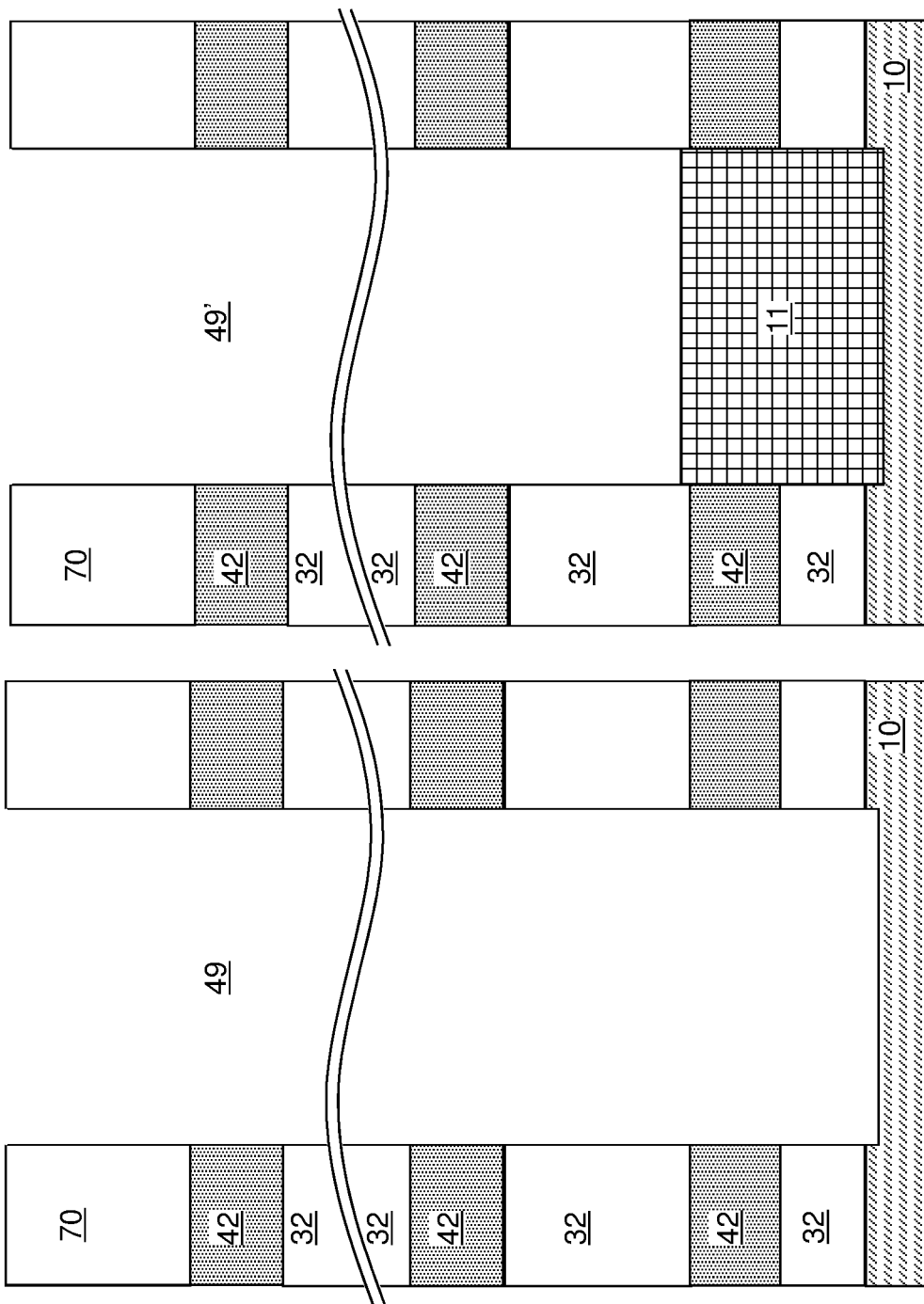

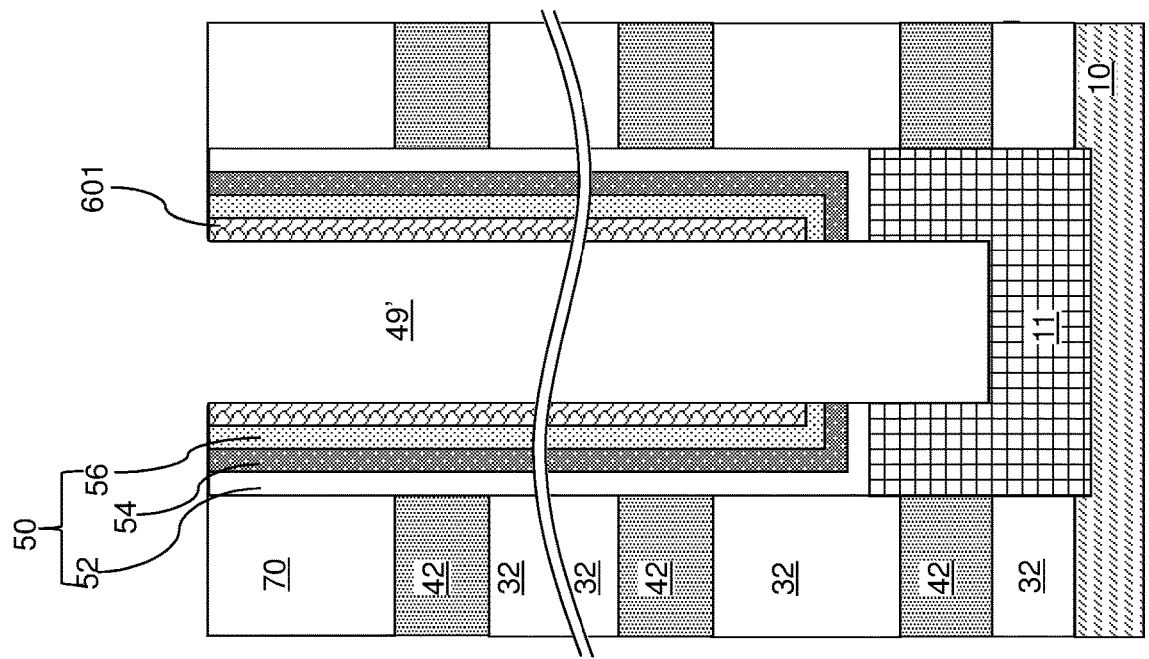
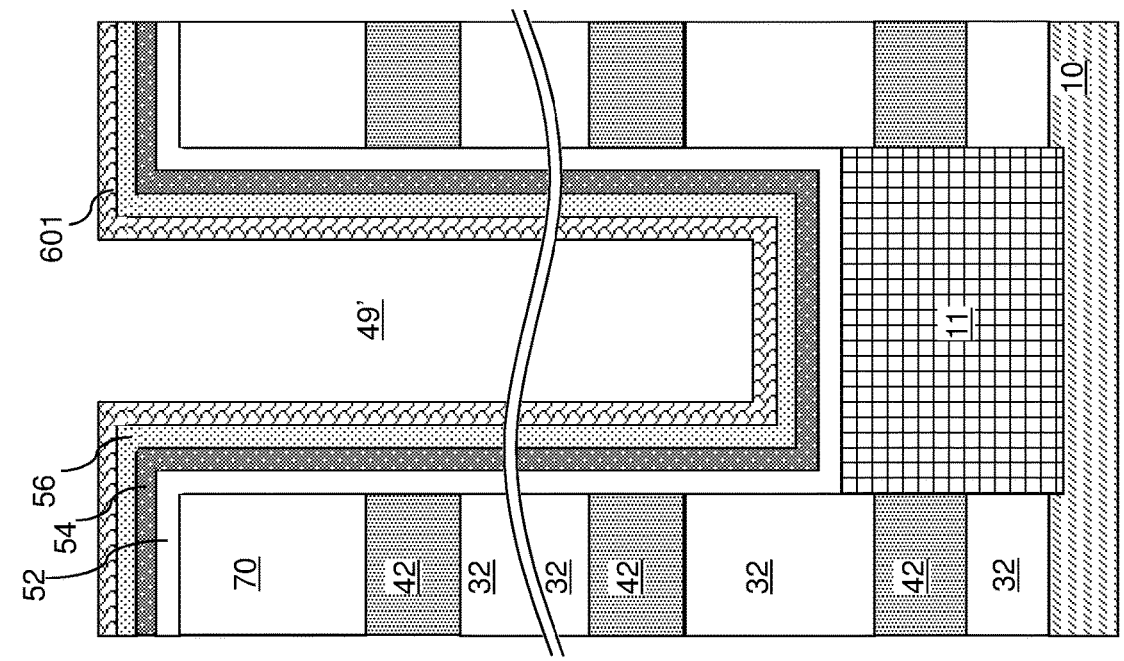

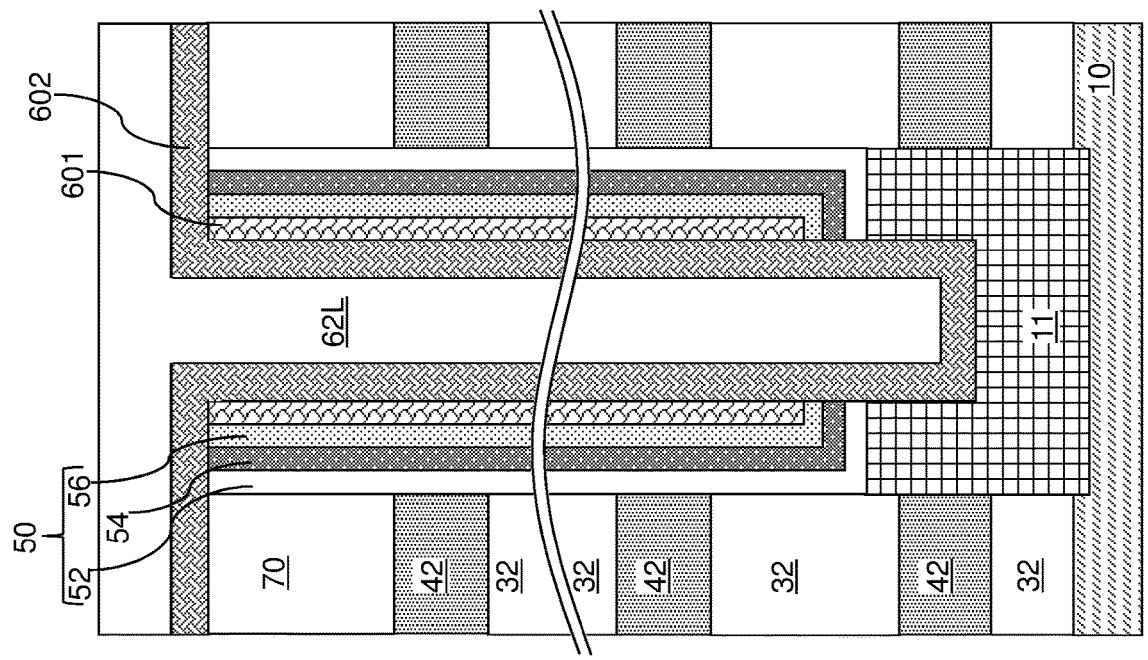
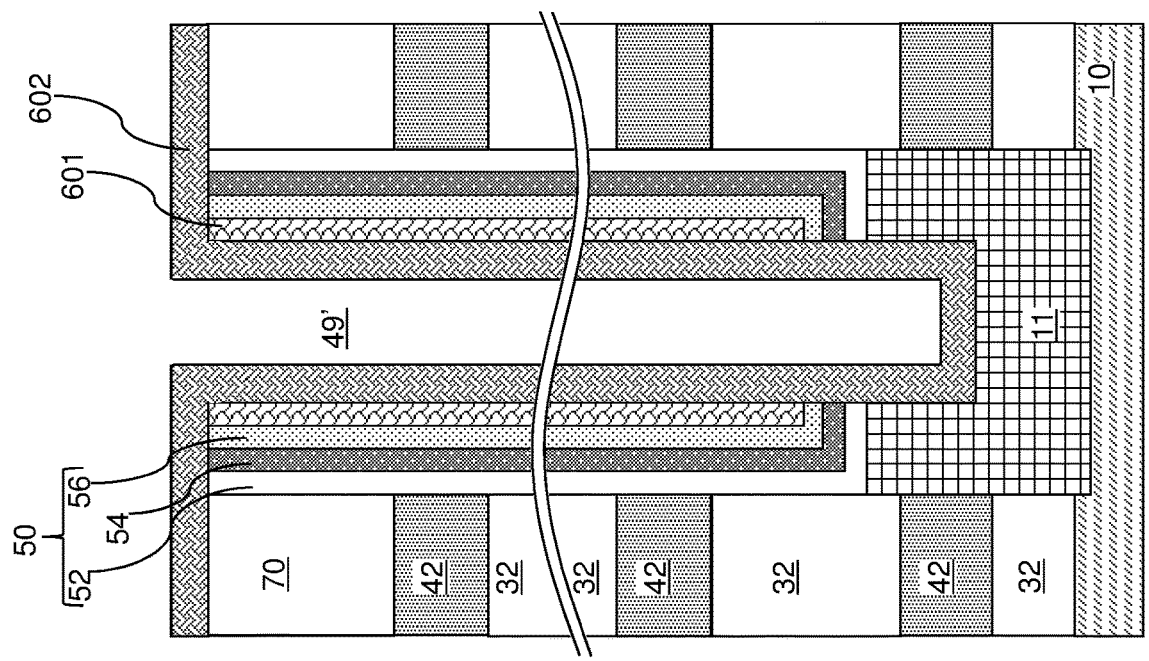

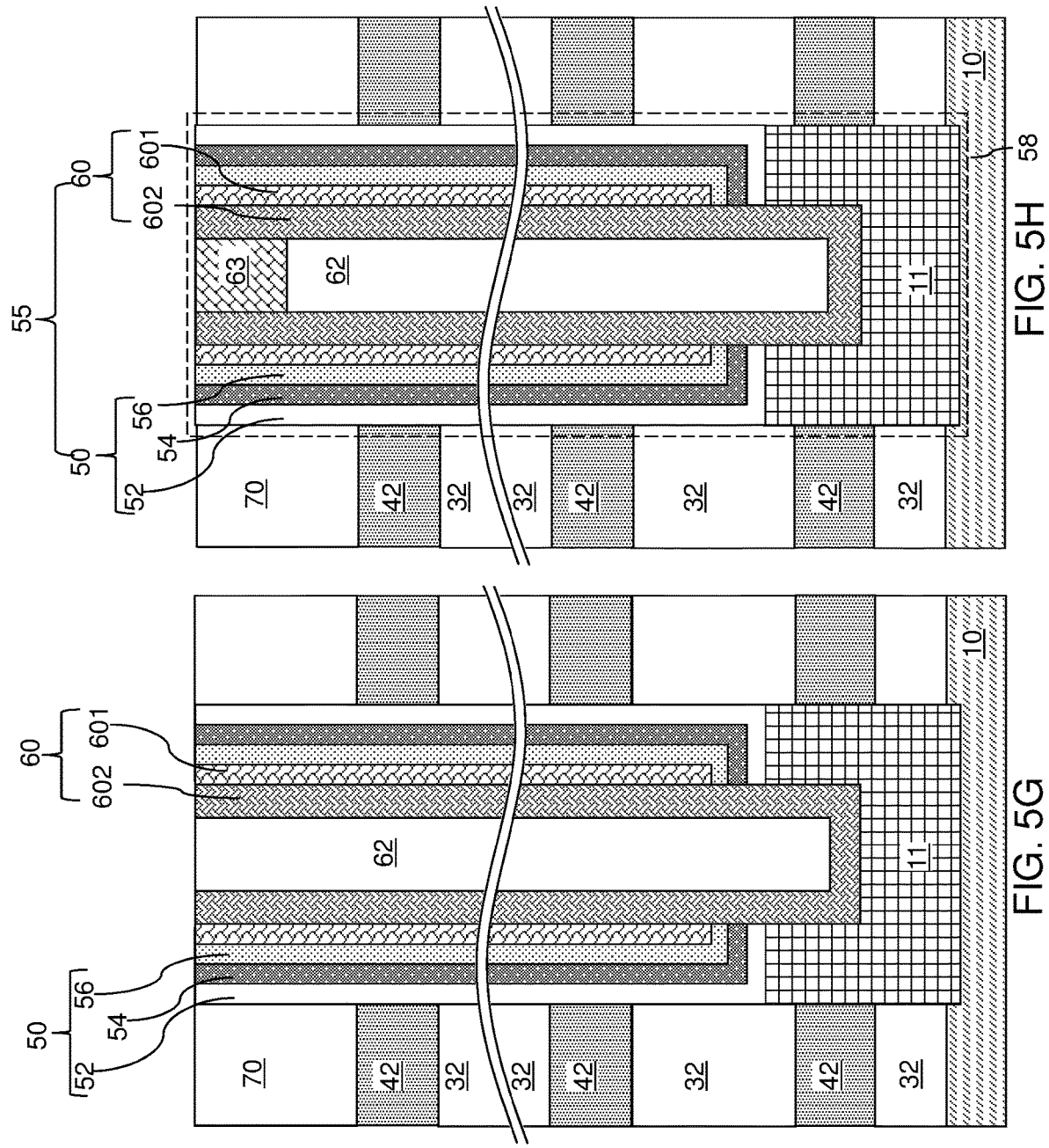

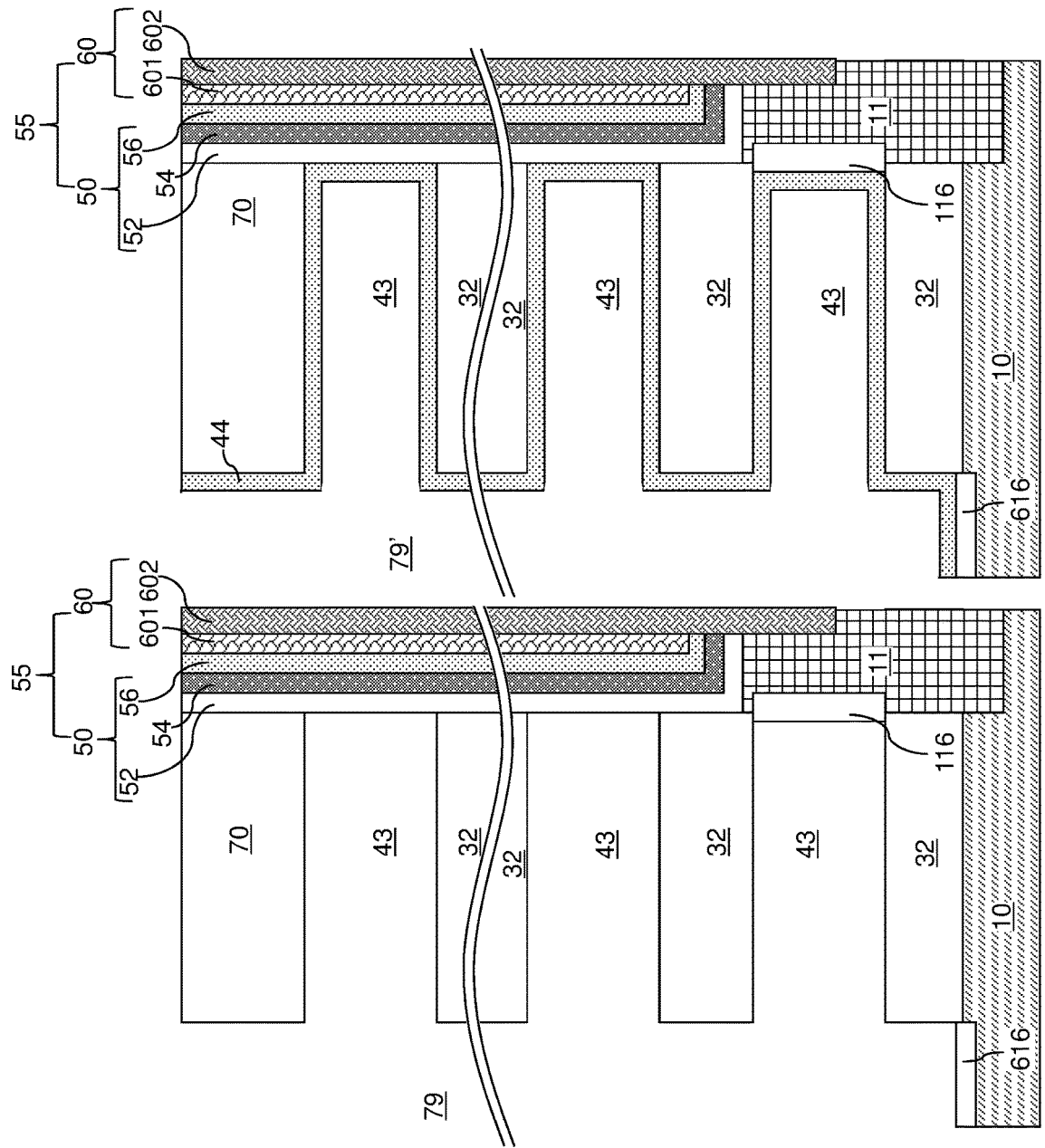

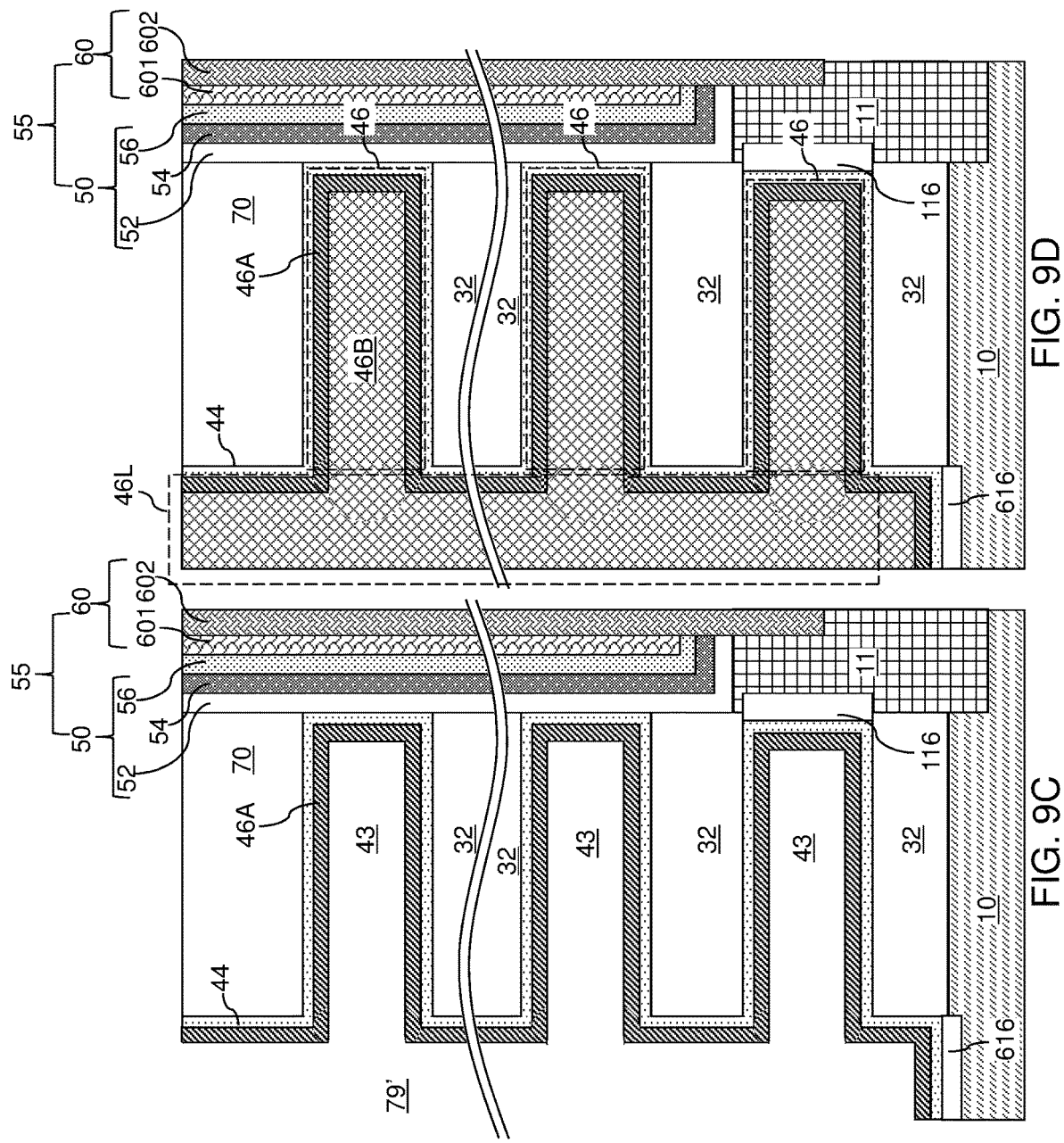

BONDED STRUCTURE INCLUDING A PERFORMANCE-OPTIMIZED SUPPORT CHIP AND A STRESS-OPTIMIZED THREE-DIMENSIONAL MEMORY CHIP AND METHOD FOR MAKING THE SAME

FIELD

The present disclosure relates generally to the field of semiconductor devices, and particularly to a bonded structure including a performance-optimized support chip and a stress-optimized three-dimensional memory chips using different crystallographic orientations for die directions and methods of manufacturing the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a bonded assembly is provided, which comprises: a memory die including a three-dimensional memory array located on a first single crystalline semiconductor substrate; and a logic die including peripheral circuitry located on a second single crystalline semiconductor substrate and bonded to the memory die. The three-dimensional memory array comprises word lines that laterally extend along a first horizontal direction and bit lines laterally extending along a second horizontal direction; the logic die comprises field effect transistors having semiconductor channels configured to flow electrical current along a channel direction selected from the first horizontal direction and the second horizontal direction; the first single crystalline semiconductor substrate has a set of first crystallographic orientations such that a <100> direction of the set of first crystallographic orientations is parallel to a vertical direction, a first <110> direction of the set of first crystallographic orientations is parallel to the first horizontal direction, and a second <110> direction of the set of first crystallographic orientations is parallel to the second horizontal direction; and the second single crystalline semiconductor substrate has a set of second crystallographic orientations such that a direction other than any <100> direction of the set of second crystallographic orientations is parallel to the vertical direction or a direction other than any <110> direction of the set of second crystallographic orientations is parallel to one of the first horizontal direction and the second horizontal direction.

According to another embodiment of the present disclosure, a method for forming a bonded assembly is provided, which comprises: providing a memory die including a three-dimensional memory array located on a first single crystalline semiconductor substrate, wherein the three-dimensional memory array comprises word lines that laterally extend along a first memory die horizontal direction and bit lines laterally extending along a second memory die horizontal direction, and the first single crystalline semiconductor substrate has a set of first crystallographic orientations such that a <100> direction of the set of first crystallographic orientations is perpendicular to a planar top surface of the first single crystalline semiconductor substrate, a first <110> direction of the set of first crystallographic orientations is parallel to the first memory die horizontal direction, and a second <110> direction of the set of first crystallographic orientations is parallel to the second memory die horizontal direction; providing a logic die including a peripheral circuitry located on a second single crystalline semiconductor substrate, wherein the logic die comprises field effect transistors having semiconductor channels configured to flow electrical current along a channel direction, and the second single crystalline semiconductor substrate has a set of second crystallographic orientations such that a direction other than any <100> direction of the set of second crystallographic orientations is perpendicular to a planar top surface of the second single crystalline semiconductor substrate or a direction other than any <110> direction of the set of second crystallographic orientations is parallel to the channel direction; and bonding the logic die to the memory die such that the channel direction of the logic die is parallel to the first memory die horizontal direction or to the second memory die horizontal direction.

According to another embodiment of the present disclosure, a method for forming a bonded assembly comprises providing at least one memory die including a three-dimensional memory array located on a zero degree notch single crystalline silicon wafer, providing at least one logic die including a peripheral circuitry located on a forty five degree notch single crystalline silicon wafer, and bonding the at least one logic die to the at least one memory die.

BRIEF DESCRIPTION OF THE DRAWINGS

FIG. 2 is a schematic vertical cross-sectional view of an in-process memory die after formation of an alternating stack of insulating layers and sacrificial material layers according to an embodiment of the present disclosure.

FIGS. 5A-5H are sequential schematic vertical cross-sectional views of a memory opening within the in-process memory die during formation of a memory stack structure, an optional dielectric core, and a drain region therein according to an embodiment of the present disclosure.

FIGS. 9A-9D are sequential vertical cross-sectional views of a region of the in-process memory die during formation of electrically conductive layers according to an embodiment of the present disclosure.

DETAILED DESCRIPTION

Figure 1A:
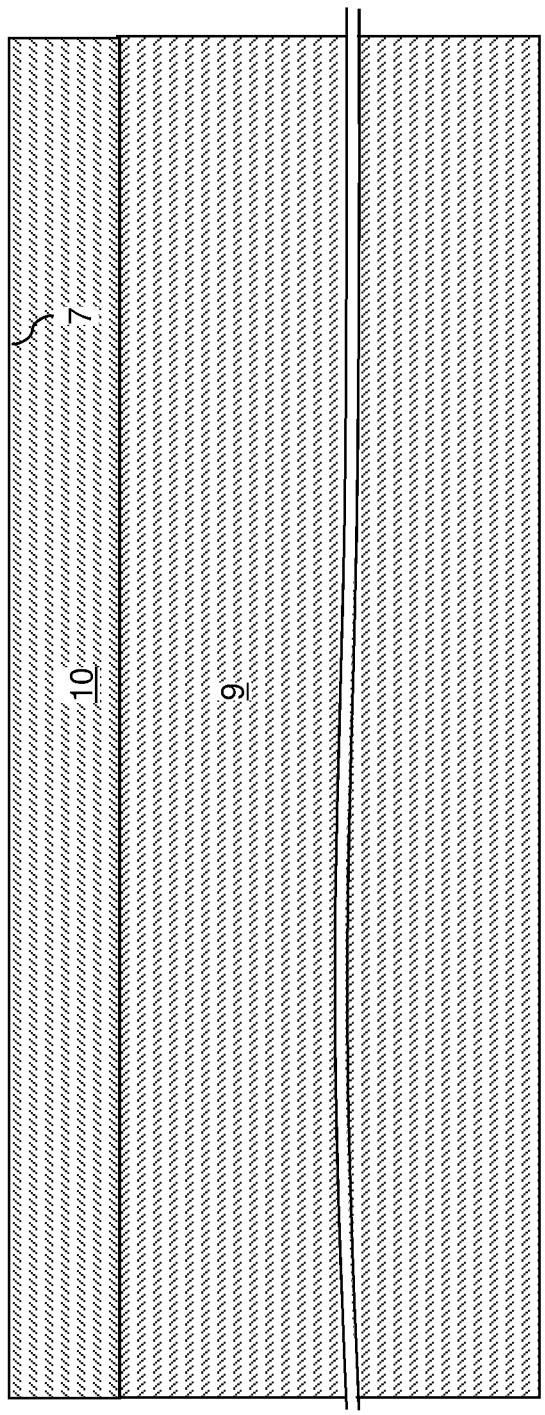
FIG. 1A is a vertical cross-sectional view of a region of a first single crystalline semiconductor substrate according to an embodiment of the present disclosure.

Support (i.e., driver) circuitry is used to perform write, read, and erase operations of the memory cells in a three-dimensional NAND memory device. Performance of the support circuitry is limited by the crystallographic orientations of the substrate on which the devices of the support circuitry are formed. At the same time, the reliability of the three-dimensional memory device is affected by the mechanical stress affected by the crystallographic orientations of the three-dimensional vertical NAND strings. Embodiments of the present disclosure provide a bonded structure including high performance support devices and three-dimensional NAND strings that minimize adverse effects of mechanical stress. Specifically, the embodiments of the present disclosure are directed to a bonded structure including a performance-optimized support chip and a stress-optimized three-dimensional memory chips using different crystallographic orientations for die directions and methods of manufacturing the same, various embodiments of which are described below. The embodiments of the disclosure may be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Generally, a semiconductor package (or a "package") refers to a unit semiconductor device that may be attached to a circuitry board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of dies therein. Each die includes one or more planes. Identical concurrent operations may be executed in each plane within a same die, although there may be some restrictions. In case a die is a memory die (i.e., a die including memory elements), concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
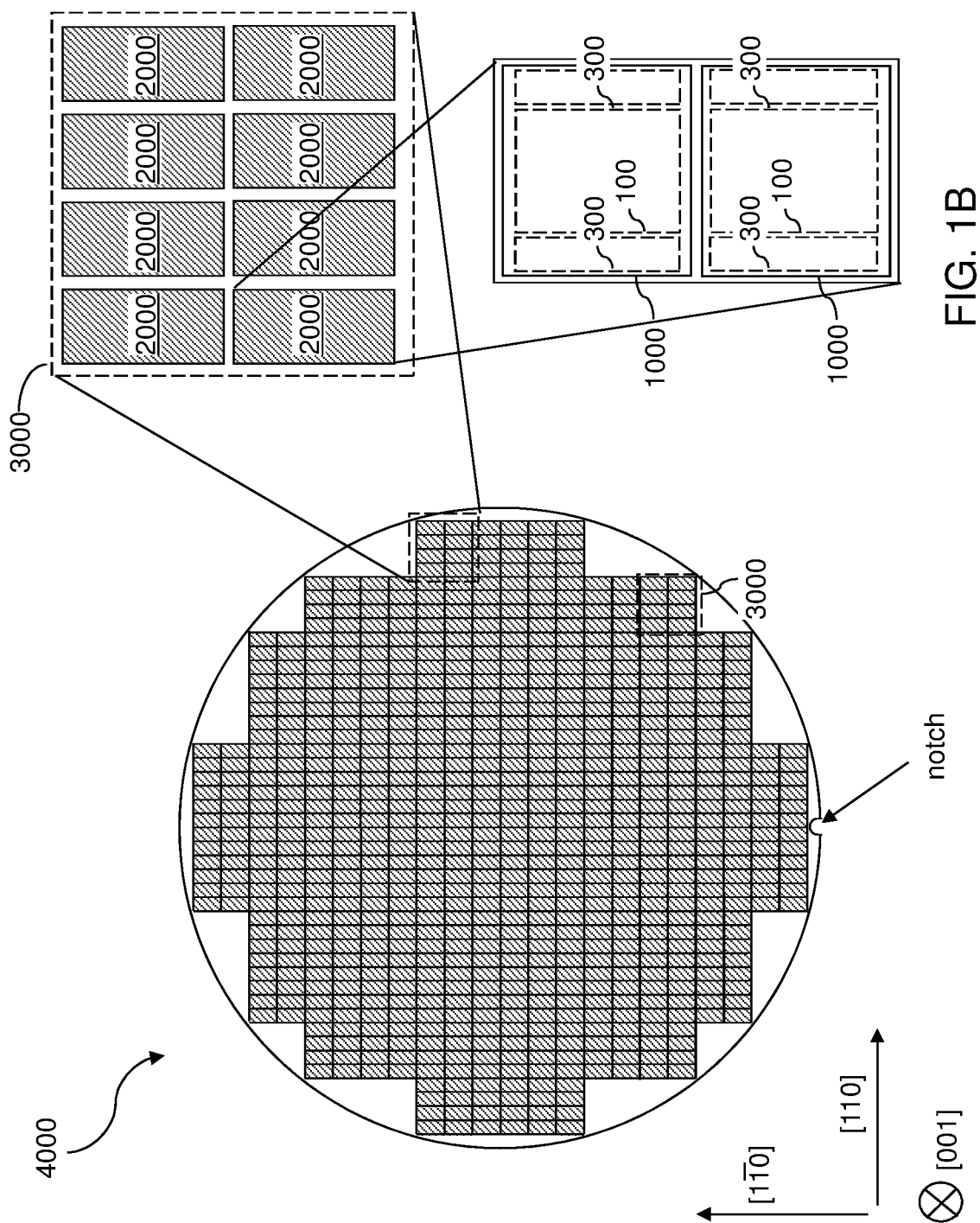
FIG. 1B is a plan view of first exemplary exposure fields on the first single crystalline semiconductor substrate according to an embodiment of the present disclosure.
Figure 1C:
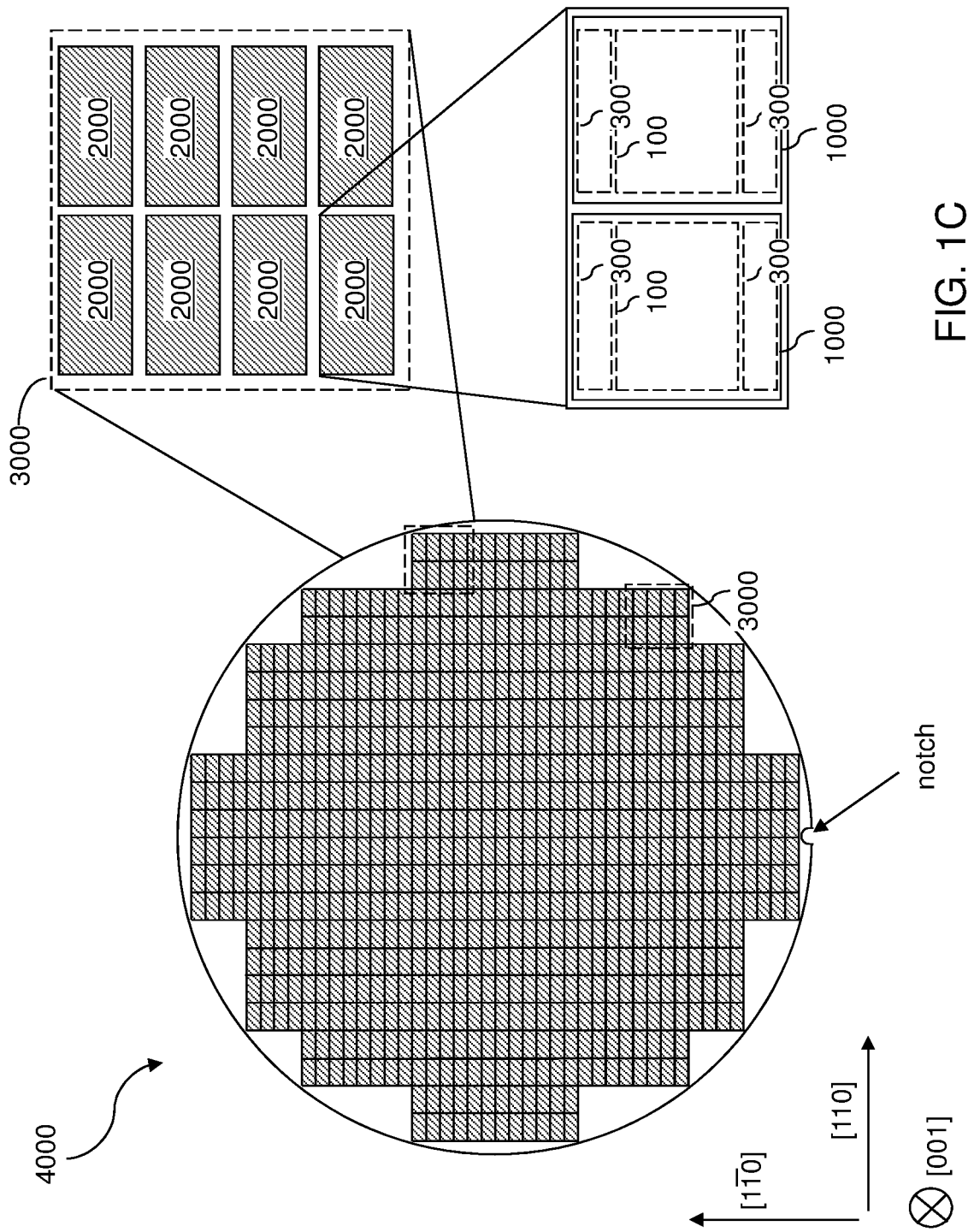
FIG. 1C is a plan view of second exemplary exposure fields on the first single crystalline semiconductor substrate according to an embodiment of the present disclosure.

Referring to FIGS. 1A-1C, a wafer 4000 including a first single crystalline semiconductor substrate (9, 10) is illustrated with a layout of a plurality of exposure fields 3000 to be used on the wafer 4000 to form a plurality of semiconductor dies. The semiconductor dies may include memory dies 2000, each of which may include a three-dimensional array of memory elements. FIG. 1A is a vertical cross-sectional view of a region of a first single crystalline semiconductor substrate (9, 10) contained within the wafer 4000. FIG. 1B is a plan view of first exemplary exposure fields 3000 that may be used on the wafer 4000, and FIG. 1C is a plan view of second exemplary exposure fields 3000 that may be used on the wafer 4000. The first exemplary exposure fields 3000 and the second exemplary exposure fields 3000 are alternative examples of exposure fields that may be used to practice embodiments of the present disclosure.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

The wafer 4000 may be a single crystalline semiconductor wafer such as a single crystalline silicon wafer. As such, the first single crystalline semiconductor substrate (9, 10) includes portions of a single crystalline semiconductor material. The front side of the wafer 4000 may have a major surface 7, i.e., a surface that includes at least 50% of the area provided by the largest area of the wafer. The major surface 7 located on the front side of the wafer 4000 may be a surface having the greatest area selected from the surfaces of the wafer 4000, while a backside surface located on the back side of the wafer may be another surface having the greatest area selected from the surfaces of the wafer 4000. The major surface 7 may be a planar surface, i.e., a surface contained within a Euclidean plane. The first single crystalline semiconductor substrate (9, 10) may include a bulk semiconductor substrate portion 9 and a semiconductor material layer 10 located on the front side of the bulk semiconductor substrate portion 9. The semiconductor material layer 10 may be epitaxially aligned to the bulk semiconductor substrate portion 9 such that the crystallographic orientations (as specified by a set of all crystallographic orientations within a single crystalline material portion) may be identical between the semiconductor material layer 10 and the bulk semiconductor substrate portion 9. The semiconductor material layer 10 corresponds to a portion of the first single crystalline semiconductor substrate (9, 10) that is incorporated into memory dies 2000 after subsequent thinning of the first single crystalline semiconductor substrate (9, 10), which removes the bulk semiconductor substrate portion 9, for example, by grinding. The thickness of the semiconductor material layer 10 may be in a range from 2 micron to 100 microns, although lesser and greater thicknesses may also be used. The wafer 4000 may be a commercial single crystalline wafer such as a silicon wafer.

According to an embodiment of the present disclosure, the major surface 7 of the first single crystalline semiconductor substrate (9, 10) is parallel to the {100} crystallographic planes of the first single crystalline semiconductor substrate (9, 10). The first single crystalline semiconductor substrate (9, 10) has a set of first crystallographic orientations such that a <100> direction of the set of first crystallographic orientations is perpendicular to a planar top surface, i.e., the major surface 7, of the first single crystalline semiconductor substrate (9, 10). Considering the direction of the surface normal of the major surface 7 as a vertical direction and considering directions within the surface of the major surface 7 as horizontal planes, the vertical direction of the first single crystalline semiconductor substrate (9, 10) is perpendicular to {100} crystallographic planes of the first single crystalline semiconductor substrate (9, 10). In Miller index notation for crystallographic planes, {100} crystallographic planes refer to all crystallographic planes that are crystallographically equivalent to a (100) plane through crystal symmetry. The crystallographic direction of the first single crystalline semiconductor substrate (9, 10) that is perpendicular to the major surface 7 is a <100> direction, which is a direction that is crystallographically equivalent to a [100] direction through crystal symmetry. In the coordinate system used to describe the crystallographic orientations of the first single crystalline semiconductor substrate (9, 10), the direction connecting the geometrical center of the wafer 4000 and a notch (or a flat) is considered to be the y-direction, the horizontal direction that is perpendicular to the y-direction is considered to be the x-direction, and the vertical direction is considered to be the z-direction. The [001] direction of the first single crystalline semiconductor substrate (9, 10) is perpendicular to the major surface 7, i.e., extends along the vertical (z) direction. As such, the wafer 4000 is a (001) wafer, i.e., a wafer including a surface normal vector pointing along the [001] crystallographic direction. The (001) wafer is also commonly referred to as a (100) wafer or zero degree (0°) notch wafer because the Cartesian coordinate system may be rotated such that the x-axis is perpendicular to the major surface 7.

The memory dies 2000 may be formed with a respective rectangular shape. Specifically, the memory dies 2000 may be formed with a pair of sides that are parallel to the x-direction (i.e., the horizontal direction that is perpendicular to the direction connecting the geometrical center of the wafer 4000 to the notch) and a pair of sides that are parallel to the y-direction (i.e., the direction connecting the geometrical center of the wafer 4000 to the notch). In this case, each exposure field 3000 corresponds to the area of the wafer 4000 that is lithographically exposed during a single illumination step in a lithographic exposure tool. In case the memory dies 2000 are manufactured using lithographic exposure and development processes, each exposure field 3000 may correspond to the area of a single memory die 2000, or may correspond to the area of a plurality of memory dies 2000. In one embodiment, the exposure fields 3000 may be arranged as a subset of a rectangular array such that the exposure fields 3000 are arranged as rows and columns that fit within the area of the wafer 4000. The rows and columns of the rectangular array may be arranged along the x-direction and the y-direction. During each lithographic exposure process, a photoresist layer may be applied over the wafer 4000 and each exposure field 3000 may be sequentially lithographically exposed. Upon completion of lithographic exposure of all exposure fields 3000, the photoresist layer may be developed to generate a pattern in the developed photoresist layer. A suitable processing step such as an etch step, a deposition step, and/or an ion implantation step may be performed using the patterned photoresist layer. Generally, a sequence of processing steps including deposition steps, lithographic patterning steps, and etch steps may be used to form the memory dies 2000. Each lithographic patterning step may require a reticle for lithographic exposure.

A set of reticles may be provided to manufacture memory dies 2000. The set of reticles includes lithographic patterns for multiple exposure levels of at least one memory die 2000. Each exposure field 3000 may include a pattern for a single memory die 2000, or a pattern for a plurality of memory dies 2000. Each memory die 2000 may include a plurality of planes 1000. The memory dies 2000 are physical implementations of a design for the at least one memory die 2000 as embodied in the set of reticles. In some embodiments, each plane 1000 may include a memory array region 100 and staircase regions 300 adjoined to the memory array region 100. Preferably, each plane 1000 lacks peripheral device regions. The memory array region 100 includes a respective set of memory stack structures vertically extending through alternating stacks of insulating layers and electrically conductive layers embodying the word lines for the memory stack structures, and bit lines connected to vertical semiconductor channels within the memory stack structures. Each staircase region 300 includes stepped surfaces of the electrically conductive layers on which word line contact via structures are formed.

In case the memory dies 2000 are formed with a respective rectangular shape, each memory die 2000 may include a first memory die horizontal direction that is parallel to a pair of sidewalls of the memory die 2000 and a second memory die horizontal direction that is parallel to another pair of sidewalls of the memory die 2000. The first memory die horizontal direction is the direction that connect neighboring pairs of a memory array region 100 and a staircase region 300 within each memory die 2000. The second memory die horizontal direction is the horizontal direction that are perpendicular to the first memory die horizontal direction within each memory die 2000.

The first memory die horizontal direction may be parallel to one of the x-direction and the y-direction, and the second memory die horizontal direction may be parallel to another of the x-direction and the y-direction. Each first memory die horizontal direction of a memory die 2000 is perpendicular to the interface between a neighboring pair of a memory region 100 and a staircase region 300 within the memory die. Each second memory die horizontal direction of a memory die 2000 is parallel to the interface between a neighboring pair of a memory region 100 and a staircase region 300 within the memory die. In the layout illustrated in FIG. 1B, the first memory die horizontal direction is parallel to the x-direction and the second memory die horizontal direction is parallel to the y-direction. In the layout illustrated in FIG. 1C, the first memory die horizontal direction is parallel to the y-direction and the second memory die horizontal direction is parallel to the x-direction.

According to an embodiment of the present disclosure, a first <110> direction of the set of first crystallographic orientations is parallel to the first memory die horizontal direction, and a second <110> direction of the set of first crystallographic orientations is parallel to the second memory die horizontal direction. In the embodiment illustrated in FIG. 1B, the first <110> direction of the set of first crystallographic orientations may be parallel to the x-direction, and the second <110> direction of the set of first crystallographic orientations may be parallel to the y-direction. In this case, the first <110> direction of the set of first crystallographic orientations may be a [110] direction, and the second <110> direction of the set of first crystallographic orientations may be a [1 −1 0] direction. The [110] direction is one of the <110> directions, and the [1 −1 0] direction is another of the <110> directions. In the embodiment illustrated in FIG. 1C, the first <110> direction of the set of first crystallographic orientations may be parallel to the y-direction, and the second <110> direction of the set of first crystallographic orientations may be parallel to the x-direction. In this case, the first <110> direction of the set of first crystallographic orientations may be a [1 −1 0] direction, and the second <110> direction of the set of first crystallographic orientations may be a [110] direction. The [1 −1 0] direction is one of the <110> directions, and the [110] direction is another of the <110> directions.

The planar top surface of the first single crystalline semiconductor substrate (9, 10), i.e., the major surface 7, is parallel to the (001) plane of the set of first crystallographic orientations, which is a {100} plane for the set of first crystallographic orientations. As discussed above, memory dies 2000 including a respective three-dimensional memory array may be formed on the first single crystalline semiconductor substrate (9, 10) using a sequence of processing steps including lithographic exposure and development steps. The three-dimensional memory array comprises word lines that laterally extend along the first memory die horizontal direction (i.e., the direction that connect neighboring pairs of a memory array region 100 and a staircase region 300) and bit lines laterally extending along the second memory die horizontal direction (i.e., the horizontal direction that are perpendicular to the first memory die horizontal direction).

FIGS. 2-14 illustrate an exemplary memory array structure that may be incorporated into each plane 1000 in the memory dies 2000 over the wafer 4000. The exemplary memory array structure is formed such that the word lines are parallel to the first memory die horizontal direction and the bit lines are parallel to the second memory die horizontal direction. Thus, both the word lines and the bit lines laterally extend along a respective one of the <110> directions, which provides greater resistance to deformation (higher Young's modulus) than other crystallographic directions such as <100> directions. By forming the word lines and the bit lines of the exemplary memory array structure along the respective <110> directions (which are along the x-direction and the y-direction of the wafer 4000), deformation of the wafer may be minimized.

Referring to FIG. 2, a stack of an alternating plurality of first material layers (which may be insulating layers 32) and second material layers (which may be sacrificial material layer 42) may be formed over the top surface of the first single crystalline semiconductor substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is used for the insulating layers 32, tetraethyl orthosilicate (TEOS) may be used as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the first single crystalline semiconductor substrate (9, 10).

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be used. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the present disclosure is described using an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted.

Optionally, an insulating cap layer 70 may be formed over the alternating stack (32, 42). The insulating cap layer 70 includes a dielectric material that is different from the material of the sacrificial material layers 42. In one embodiment, the insulating cap layer 70 may include a dielectric material that may be used for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Figure 3:
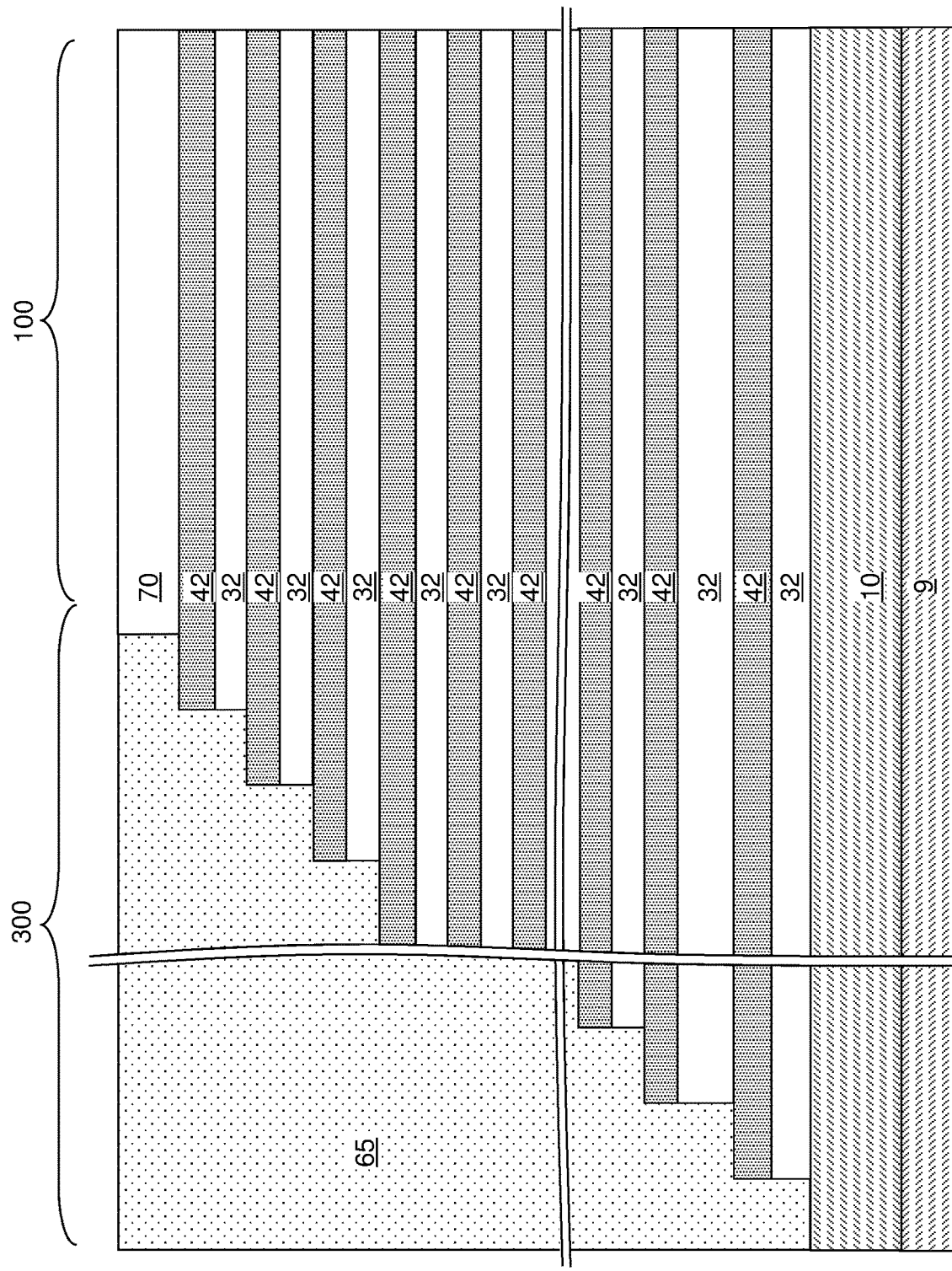
FIG. 3 is a schematic vertical cross-sectional view of the in-process memory die after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located next to the memory array region 100. The stepped cavity may have various stepped surfaces such that the horizontal cross-sectional shape of the stepped cavity changes in steps as a function of the vertical distance from the top surface of the first single crystalline semiconductor substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer 42. In one embodiment, each vertical step may have the height of a single pair of an insulating layer 32 and a sacrificial material layer 42. In another embodiment, multiple "columns" of staircases may be formed along a first memory die horizontal direction mdhd1 such that each vertical step has the height of a plurality of pairs of an insulating layer 32 and a sacrificial material layer 42, and the number of columns may be at least the number of the plurality of pairs. Each column of staircase may be vertically offset from one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets from the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first memory die horizontal direction mdhd1, and the columns of staircases may be arranged along a second memory die horizontal direction mdhd2 that is perpendicular to the first memory die horizontal direction mdhd1. In one embodiment, the first memory die horizontal direction mdhd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain select level isolation structures 72 may be formed through the insulating cap layer 70 and a subset of the sacrificial material layers 42 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the insulating cap layer 70.

Figure 4A:
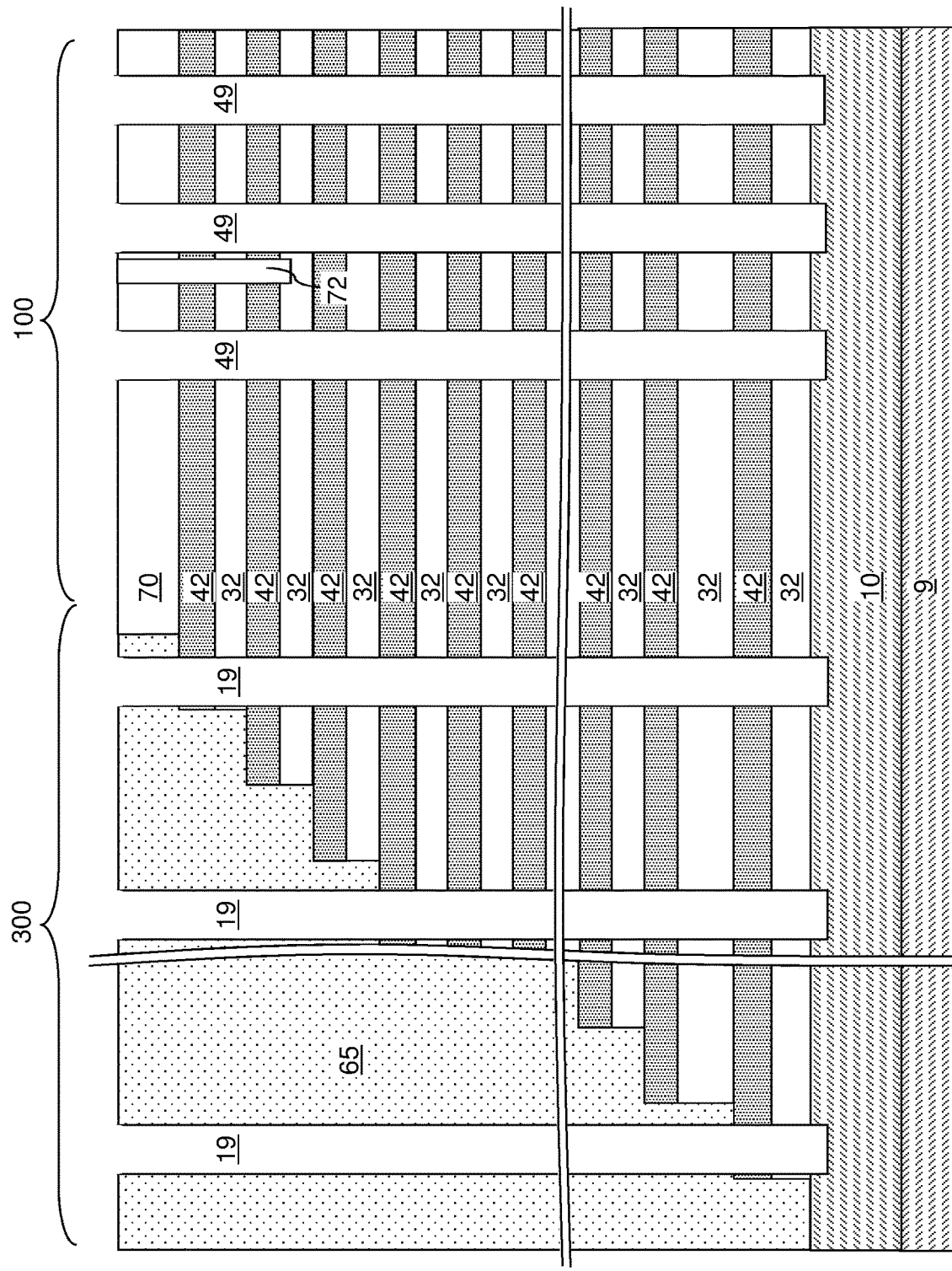
FIG. 4A is a schematic vertical cross-sectional view of the in-process memory die after formation of memory openings and support openings according to an embodiment of the present disclosure.
Figure 4B:
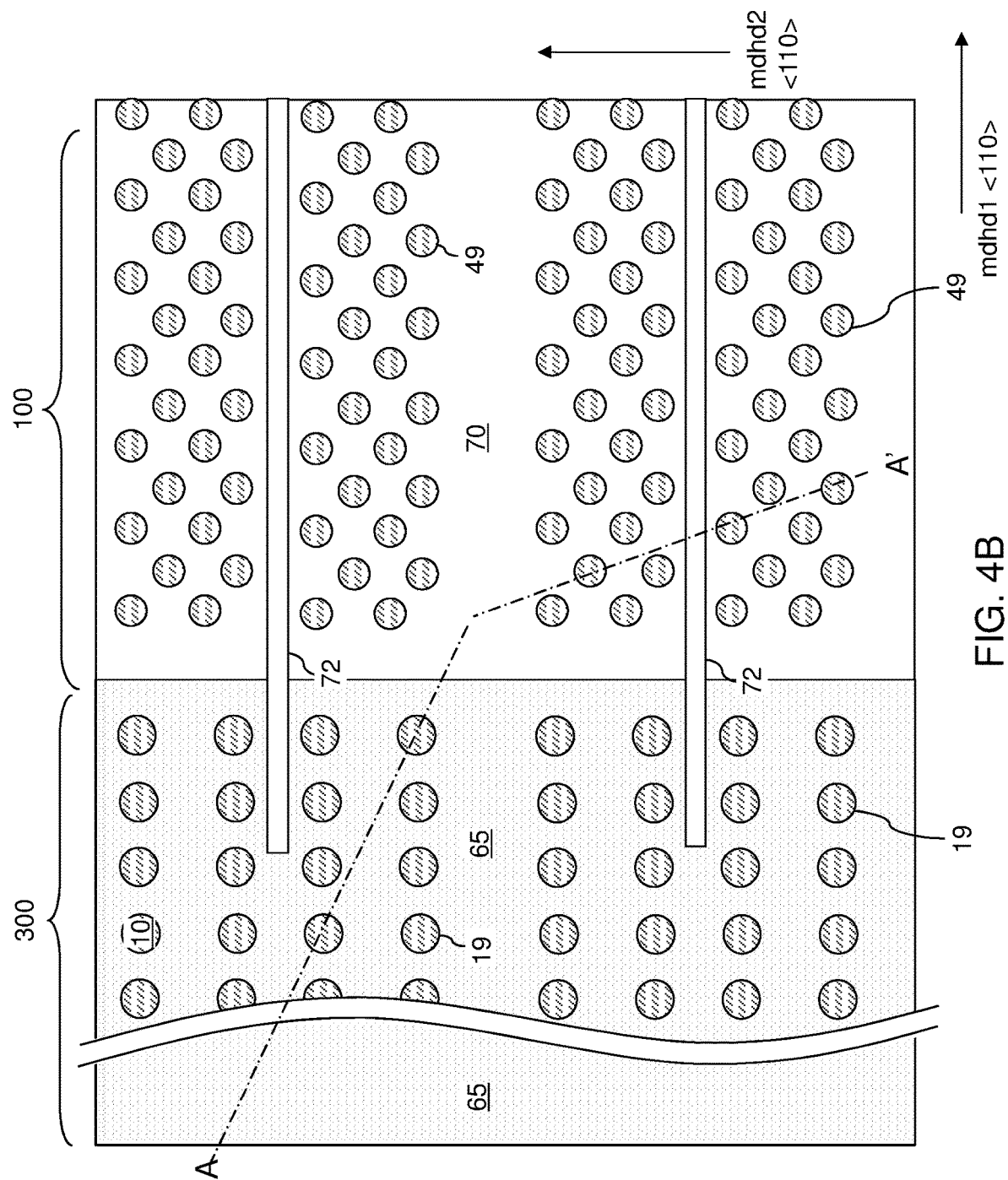
FIG. 4B is a top-down view of the in-process memory die of FIG. 4A. The vertical plane A-A' is the plane of the cross-section for FIG. 4A.

Referring to FIGS. 4A and 4B, a lithographic material stack (not shown) including at least a photoresist layer may be formed over the insulating cap layer 70 and the retro-stepped dielectric material portion 65, and may be lithographically patterned to form openings therein. The openings include a first set of openings 49 formed over the memory array region 100 and a second set of openings 19 formed over the staircase region 300. The pattern in the lithographic material stack may be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the first single crystalline semiconductor substrate (9, 10). A two-dimensional array of memory openings 49 may be formed in the memory array region 100. A two-dimensional array of support openings 19 may be formed in the staircase region 300.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Optionally, the sacrificial material layers 42 may be laterally recessed partially to form lateral recesses (not shown), for example, by an isotropic etch.

Referring to FIG. 5B, an optional pedestal channel portion (e.g., an epitaxial pedestal) 11 may be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 may be doped with electrical dopants of the same conductivity type as the semiconductor material layer 10. In one embodiment, the top surface of each pedestal channel portion 11 may be formed above a horizontal plane including the top surface of a sacrificial material layer 42. In this case, at least one source select gate electrode may be subsequently formed by replacing each sacrificial material layer 42 located below the horizontal plane including the top surfaces of the pedestal channel portions 11 with a respective conductive material layer. The pedestal channel portion 11 may be a portion of a transistor channel that extends between a source region to be subsequently formed in the first single crystalline semiconductor substrate (9, 10) and a drain region to be subsequently formed in an upper portion of the memory opening 49. A memory cavity 49' is present in the unfilled portion of the memory opening 49 above the pedestal channel portion 11.

In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts.

Referring to FIG. 5C, a stack of layers including a blocking dielectric layer 52, a charge storage layer 54, a tunneling dielectric layer 56, and an optional first semiconductor channel layer 601 may be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer.

In another embodiment, the sacrificial material layers 42 may be laterally recessed with respect to the sidewalls of the insulating layers 32, and a combination of a deposition process and an anisotropic etch process may be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be used. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 may be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' may be removed to form openings in remaining portions thereof. Each of the first semiconductor channel layer 601, the tunneling dielectric layer 56, the charge storage layer 54, and the blocking dielectric layer 52 may be etched by a respective anisotropic etch process using a respective etch chemistry, which may, or may not, be the same for the various material layers.

Each remaining portion of the first semiconductor channel layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) may be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' may be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 may have vertically coincident sidewalls.

Referring to FIG. 5E, a second semiconductor channel layer 602 may be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be used. The second semiconductor channel layer 602 may partially fill the memory cavity 49' in each memory opening, or may fully fill the memory cavity 49' in each memory opening 49.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L may be deposited in the memory cavity 49' to fill any remaining portion of the memory cavity 49' within each memory opening. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Referring to FIG. 5G, the horizontal portion of the dielectric core layer 62L may be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 may be removed by a planarization process, which may use a recess etch or chemical mechanical planarization (CMP). Each remaining portion of the second semiconductor channel layer 602 may be located entirety within a memory opening 49 or entirely within a support opening 19.

Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 may be further recessed within each memory opening, for example, by a recess etch to a depth that is located between the top surface of the insulating cap layer 70 and the bottom surface of the insulating cap layer 70. Drain regions 63 may be formed by depositing a doped semiconductor material within each recessed region above the dielectric cores 62. The drain regions 63 may have a doping of a second conductivity type that is the opposite of the first conductivity type. For example, if the first conductivity type is p-type, the second conductivity type is n-type, and vice versa. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon. Excess portions of the deposited semiconductor material may be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
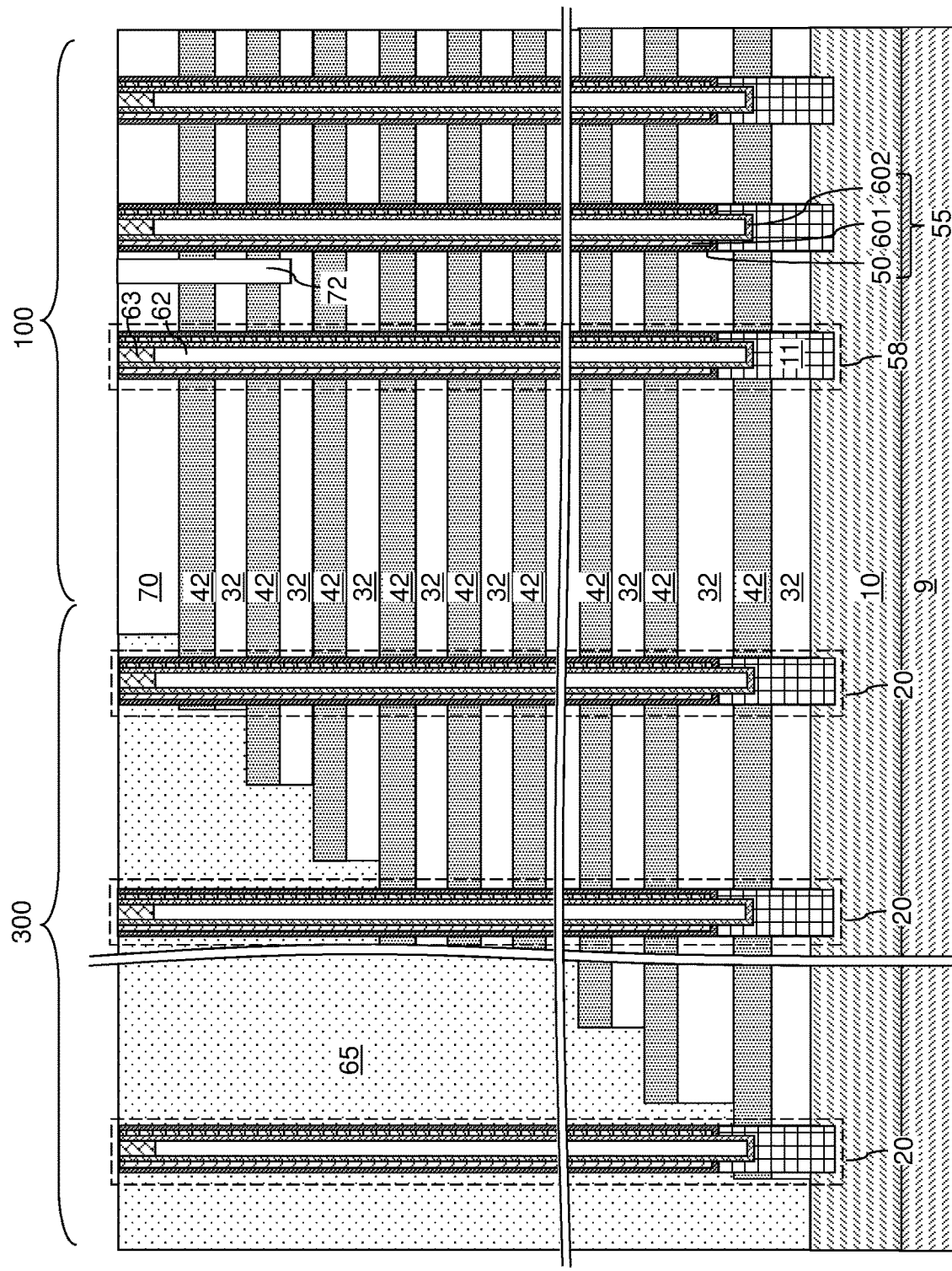
FIG. 6 is a schematic vertical cross-sectional view of the in-process memory die after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 4A and 4B. An instance of the support pillar structure 20 may be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52. While the present disclosure is described using the illustrated configuration for the memory stack structure, the methods of the present disclosure may be applied to alternative memory stack structures including different layer stacks or structures for the memory film 50 and/or for the vertical semiconductor channel 60.

Figure 7A:
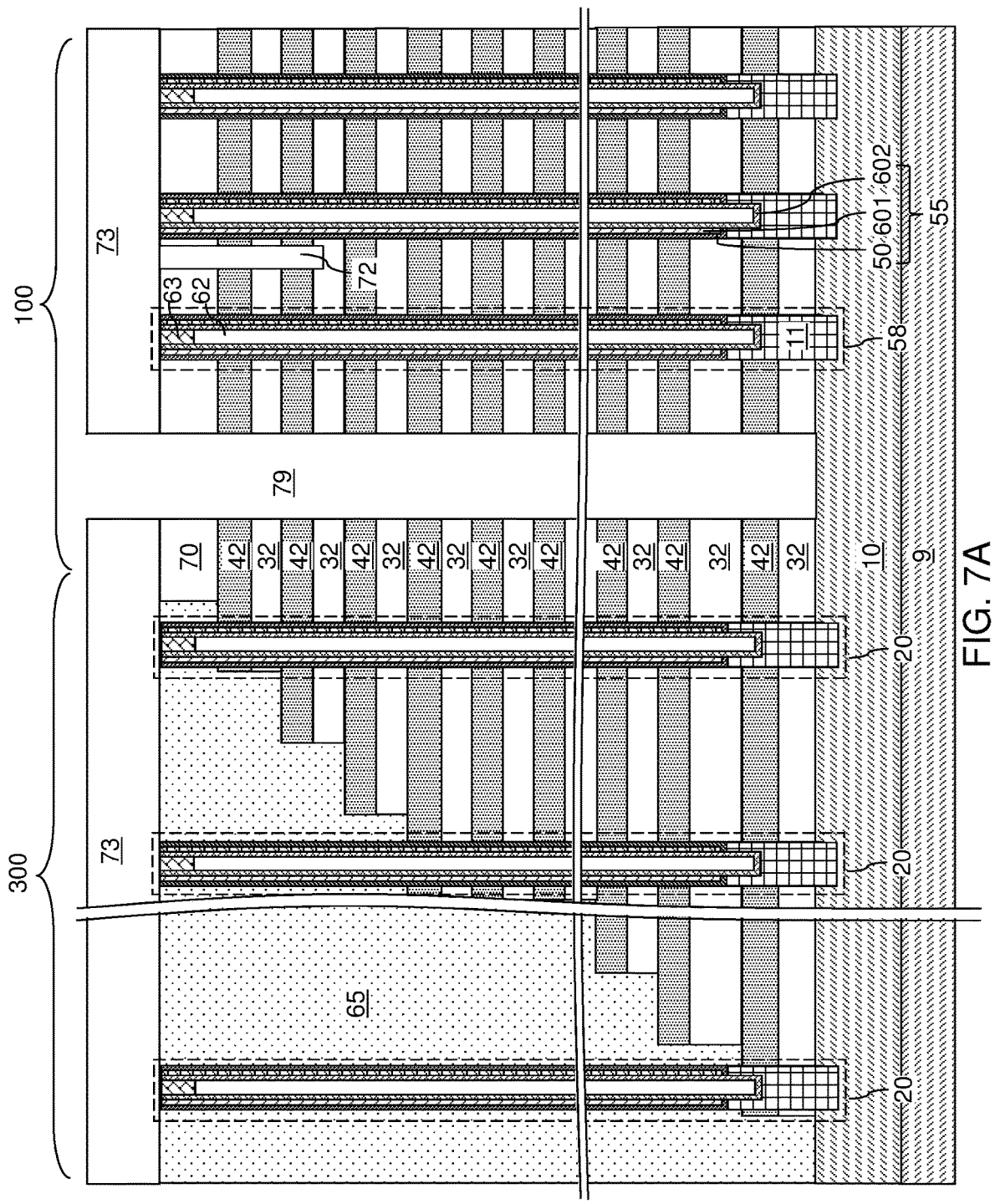
FIG. 7A is a schematic vertical cross-sectional view of the in-process memory die after formation of backside trenches according to an embodiment of the present disclosure.
Figure 7B:
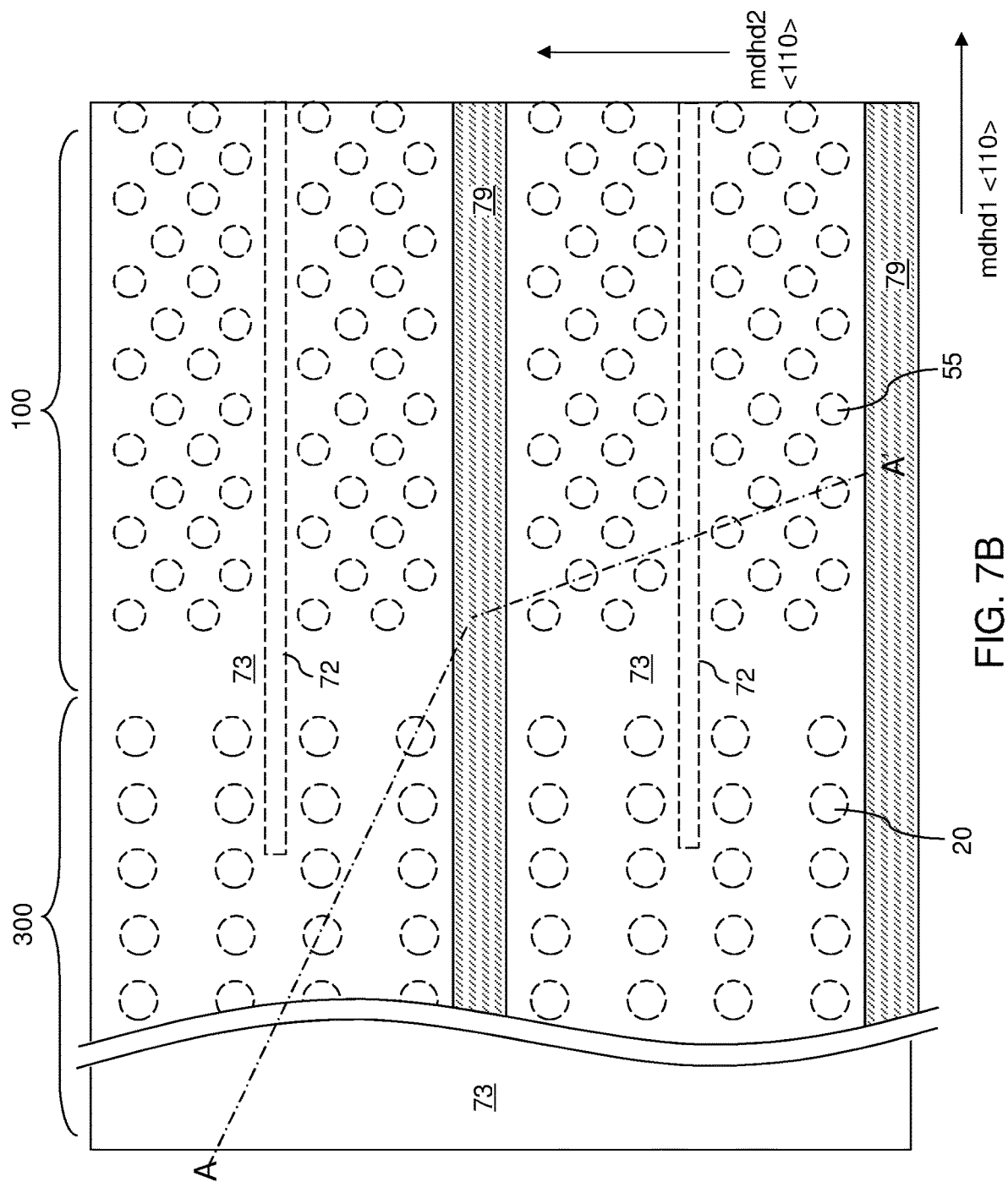
FIG. 7B is a partial see-through top-down view of the in-process memory die of FIG. 7A. The vertical plane A-A' is the plane of the schematic vertical cross-sectional view of FIG. 7A.

Referring to FIGS. 7A and 7B, a contact level dielectric layer 73 may be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be used.

A photoresist layer (not shown) may be applied over the contact level dielectric layer 73, and is lithographically patterned to form openings in areas between clusters of memory stack structures 55. The pattern in the photoresist layer may be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the first single crystalline semiconductor substrate (9, 10), and laterally extend through the memory array region 100 and the staircase region 300.

In one embodiment, the backside trenches 79 may laterally extend along a first memory die horizontal direction mdhd1 and may be laterally spaced apart from one another along a second memory die horizontal direction mdhd2 that is perpendicular to the first memory die horizontal direction mdhd1. The memory stack structures 55 may be arranged in rows that extend along the first memory die horizontal direction mdhd1. The drain select level isolation structures 72 may laterally extend along the first memory die horizontal direction mdhd1. Each backside trench 79 may have a uniform width that is invariant along the lengthwise direction (i.e., along the first memory die horizontal direction mdhd1). Each drain select level isolation structure 72 may have a uniform vertical cross-sectional profile along vertical planes that are perpendicular to the first memory die horizontal direction mdhd1 that is invariant with translation along the first memory die horizontal direction mdhd1. Multiple rows of memory stack structures 55 may be located between a neighboring pair of a backside trench 79 and a drain select level isolation structure 72, or between a neighboring pair of drain select level isolation structures 72. In one embodiment, the backside trenches 79 may include a source contact opening in which a source contact via structure may be subsequently formed. The photoresist layer may be removed, for example, by ashing.

Figure 8:
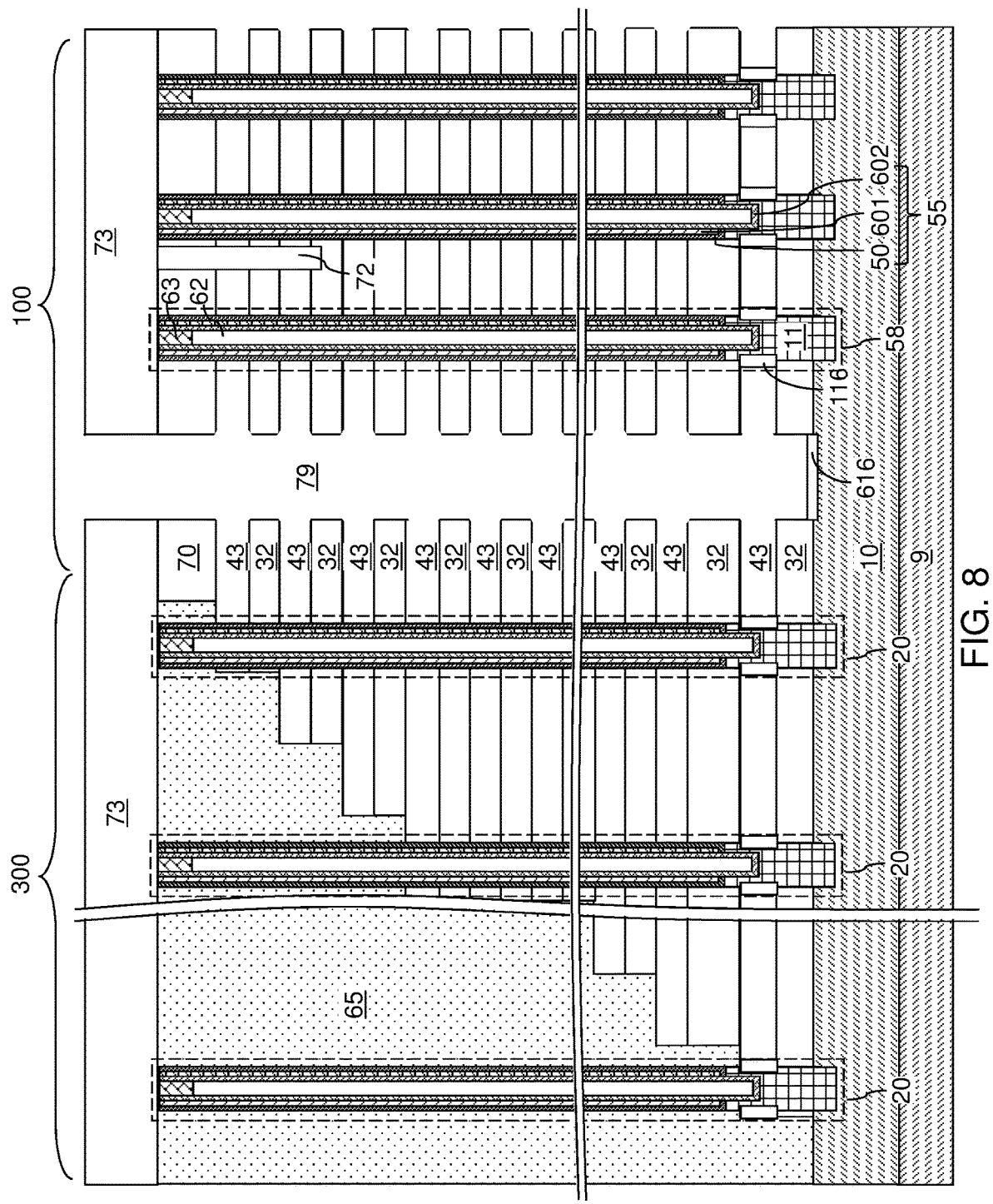
FIG. 8 is a schematic vertical cross-sectional view of the in-process memory die after formation of backside recesses according to an embodiment of the present disclosure.

Referring to FIGS. 8 and 9A, an etchant that selectively etches the second material of the sacrificial material layers 42 with respect to the first material of the insulating layers 32 may be introduced into the backside trenches 79, for example, using an etch process. FIG. 9A illustrates a region of the exemplary structure of FIG. 8. Backside recesses 43 are formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 may be selected from silicon oxide and dielectric metal oxides.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the laterally extending cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the first single crystalline semiconductor substrate (9, 10). In this case, each backside recess 43 may define a space for receiving a respective word line of the array of monolithic three-dimensional NAND strings.

Each of the plurality of backside recesses 43 may extend substantially parallel to the top surface of the first single crystalline semiconductor substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 9B, a backside blocking dielectric layer 44 may be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 may be formed in the backside recesses 43 and on a sidewall of the backside trench 79. The backside blocking dielectric layer 44 may be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 may be formed by a conformal deposition process such as atomic layer deposition (ALD). The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 may include a silicon oxide layer. The backside blocking dielectric layer 44 may be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be used. In one embodiment, the metallic barrier layer 46A may consist essentially of a conductive metal nitride such as TiN.

Figure 10:
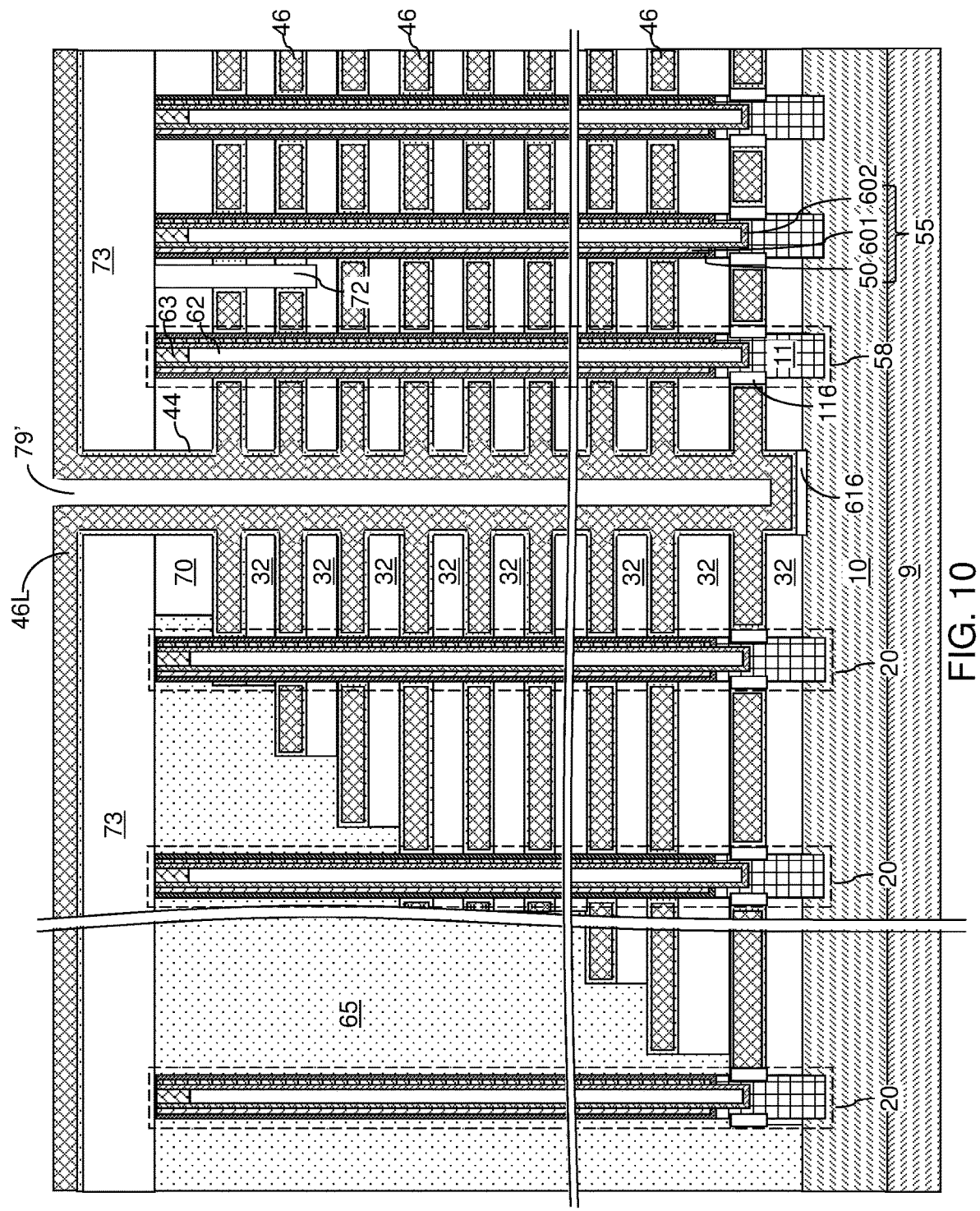
FIG. 10 is a schematic vertical cross-sectional view of the in-process memory die at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited using a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 may be formed in the plurality of backside recesses 43, and a continuous electrically conductive material layer 46L may be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 may be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
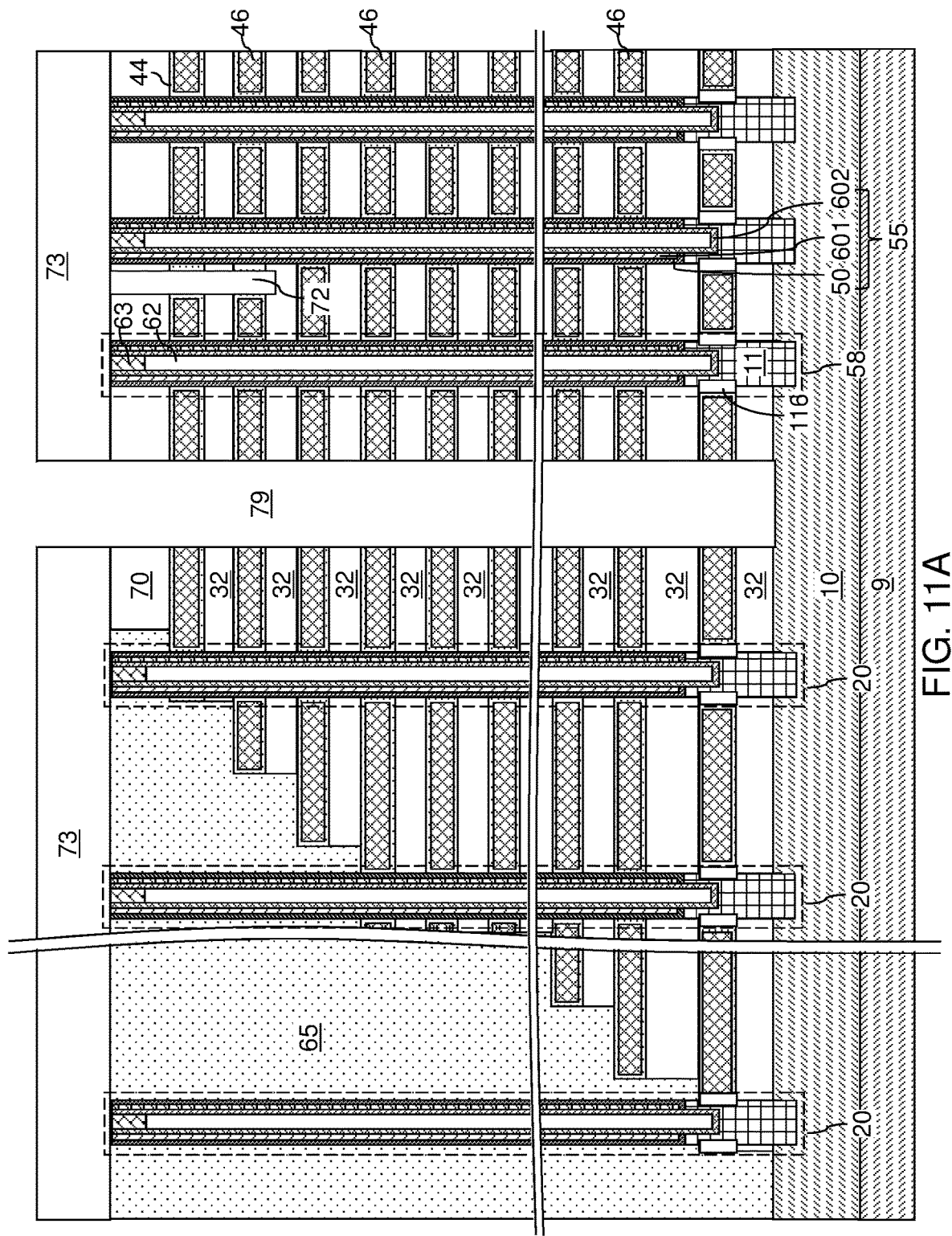
FIG. 11A is a schematic vertical cross-sectional view of the in-process memory die after removal of a deposited conductive material from within the backside trench according to an embodiment of the present disclosure.
Figure 11B:
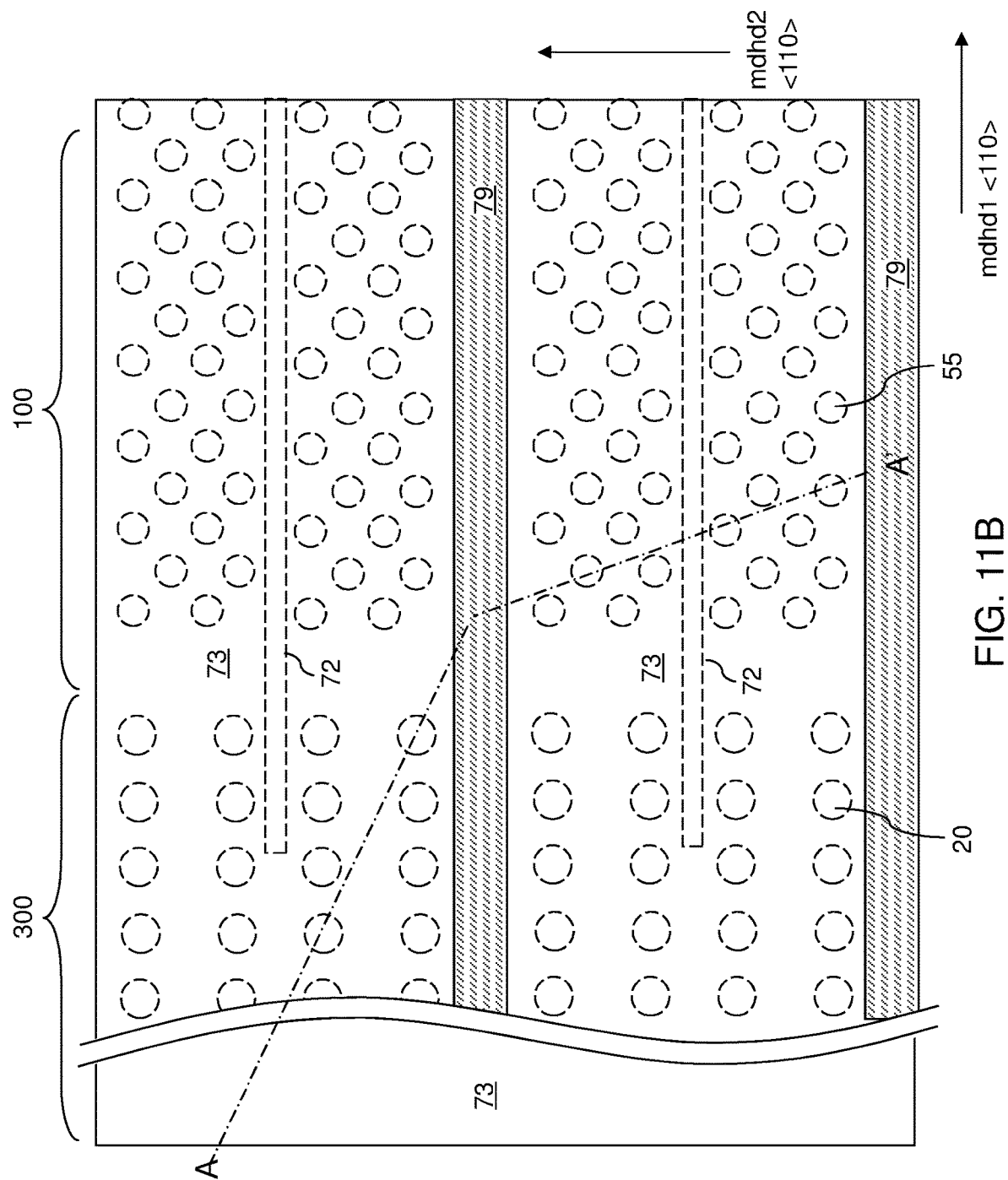
FIG. 11B is a top-down view of the in-process memory die of FIG. 11A. The vertical plane A-A' is the plane of the schematic vertical cross-sectional view of FIG. 11A.

Referring to FIGS. 11A and 11B, the deposited metallic material of the continuous electrically conductive material layer 46L is etched back from the sidewalls of each backside trench 79 and from above the contact level dielectric layer 73, for example, by an isotropic wet etch. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each electrically conductive layer 46 may function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

In one embodiment, the removal of the continuous electrically conductive material layer 46L may be selective to the material of the backside blocking dielectric layer 44. In this case, a horizontal portion of the backside blocking dielectric layer 44 may be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 may be removed during removal of the continuous electrically conductive material layer 46L. A backside cavity 79' is present within each backside trench 79.

Figure 12A:
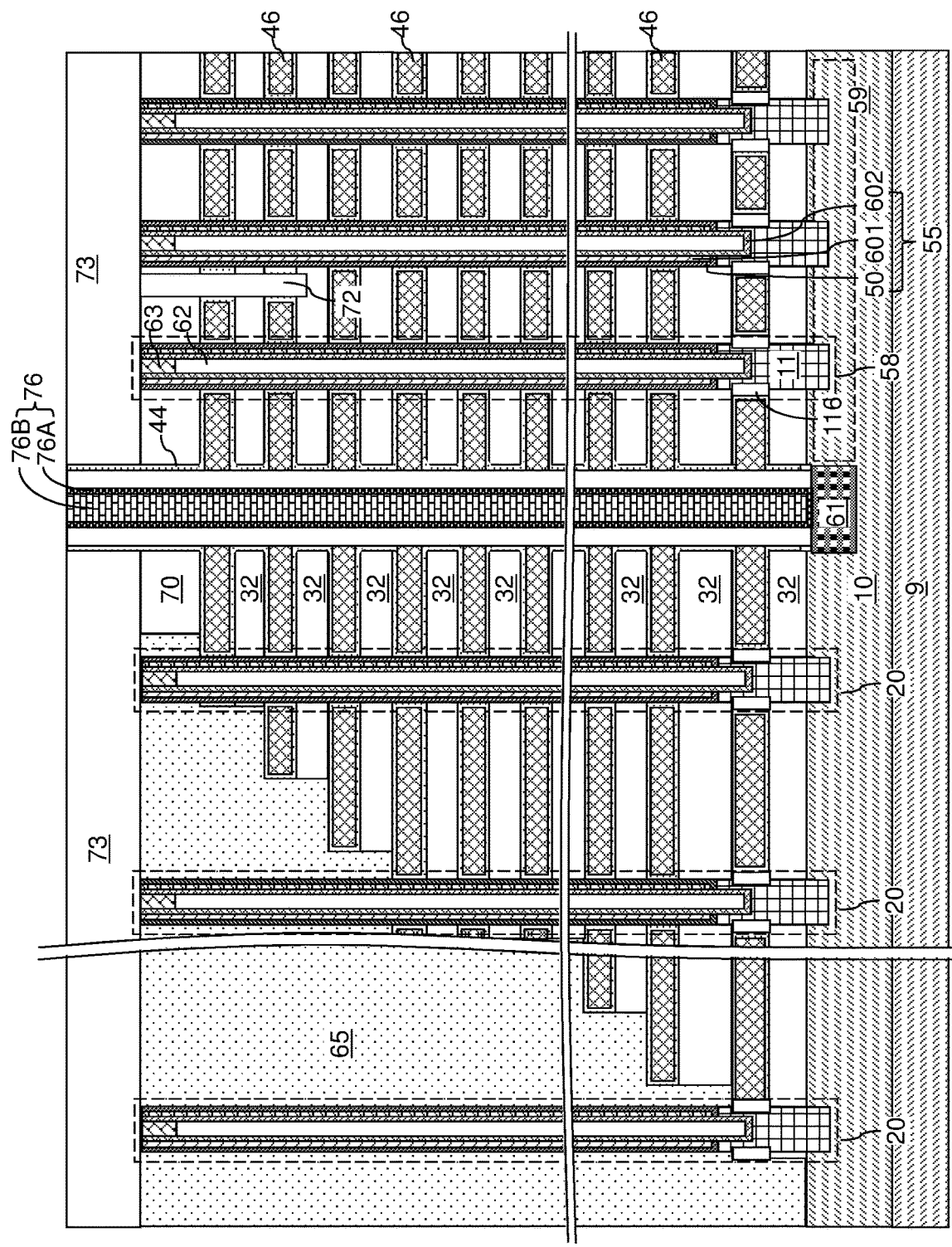
FIG. 12A is a schematic vertical cross-sectional view of the in-process memory die after formation of insulating spacers, backside contact structures, and additional contact via structures according to an embodiment of the present disclosure.
Figure 12B:
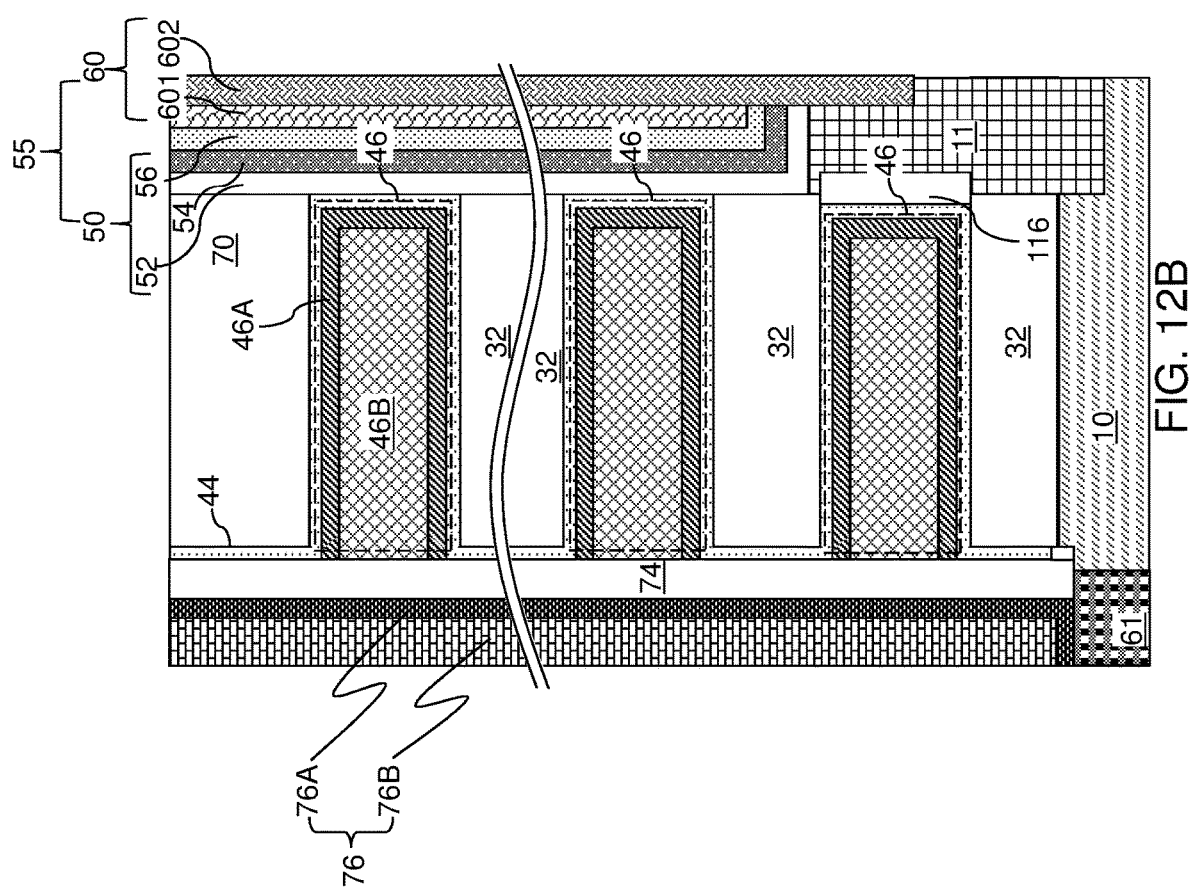
FIG. 12B is a schematic vertical cross-sectional magnified view of in-process memory die comprising a memory fill opening structure shown in FIG. 12A.

Referring to FIGS. 12A and 12B, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

If a backside blocking dielectric layer 44 is present, the insulating material layer may be formed directly on surfaces of the backside blocking dielectric layer 44 and directly on the sidewalls of the electrically conductive layers 46. If a backside blocking dielectric layer 44 is not used, the insulating material layer may be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the first single crystalline semiconductor substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Each source region 61 is formed in an upper portion of the first single crystalline semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 may be formed within each backside cavity 79'. Each contact via structure 76 may fill a respective cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized using the contact level dielectric layer 73 overlying the alternating stack (32, 46) as a stopping layer. If chemical mechanical planarization (CMP) process is used, the contact level dielectric layer 73 may be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 may contact a sidewall of the backside blocking dielectric layer 44.

Figure 13A:
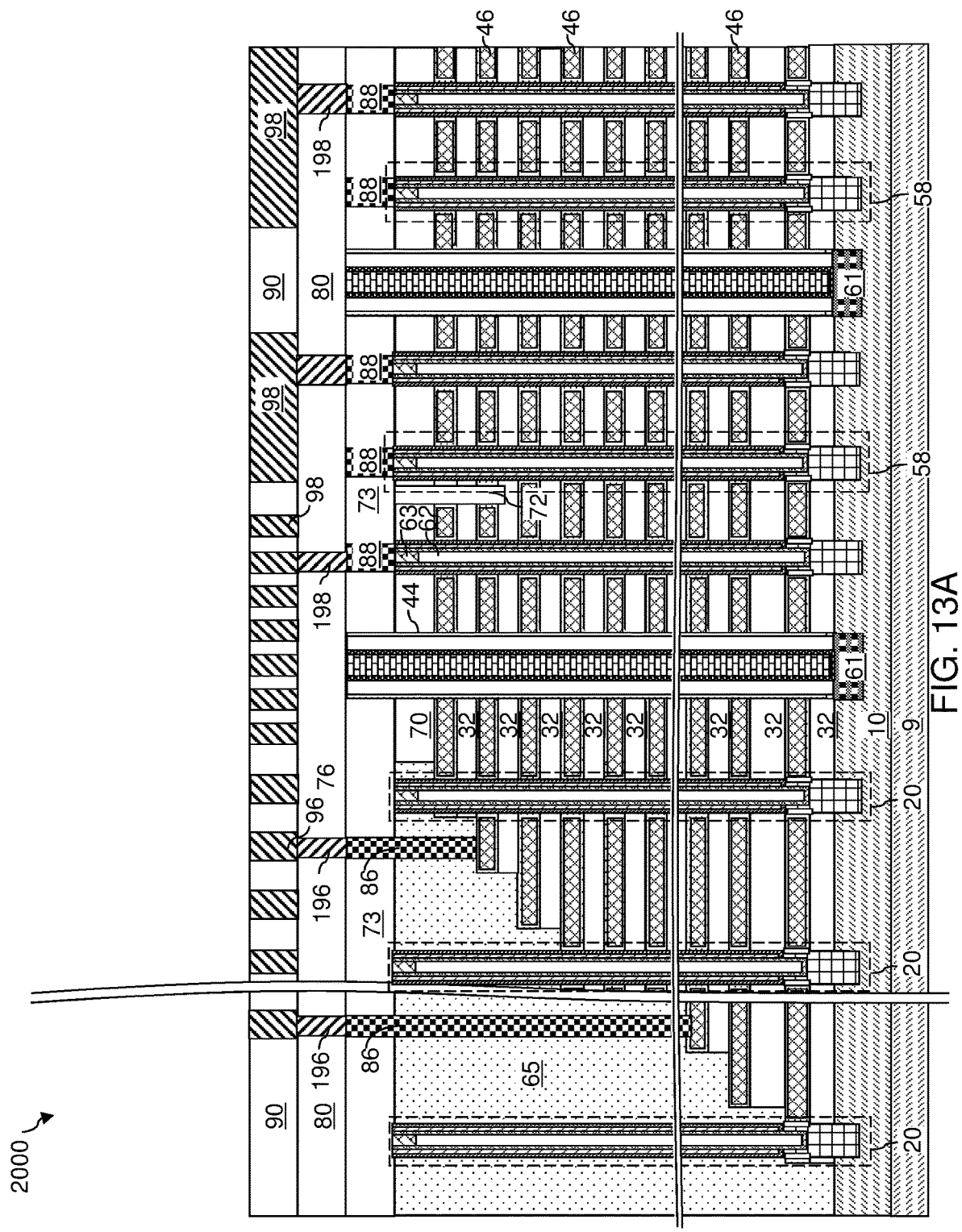
FIG. 13A is a schematic vertical cross-sectional view of the in-process memory die after formation of interconnection via structures, bit lines, and additional metal lines according to an embodiment of the present disclosure.
Figure 13B:
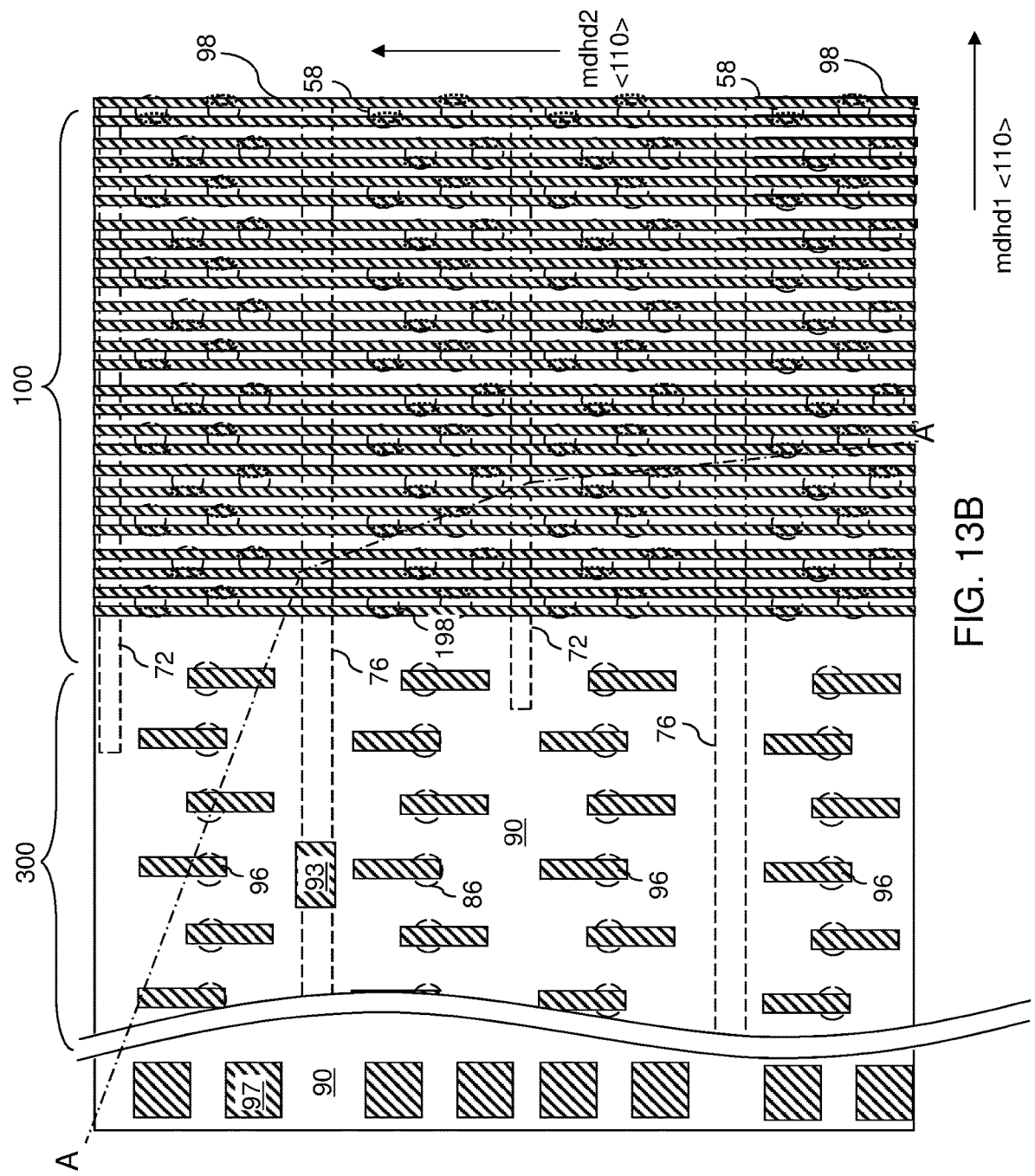
FIG. 13B is a top-down view of the in-process memory die of FIG. 13A. The vertical plane A-A' is the plane of the schematic vertical cross-sectional view of FIG. 13A.

Referring to FIGS. 13A and 13B, additional contact via structures (88, 86) may be formed through the contact level dielectric layer 73, and optionally through the retro-stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73, and through the retro-stepped dielectric material portion 65.

A via level dielectric layer 80 may be formed over the contact level dielectric layer 73. The via level dielectric layer 80 includes a dielectric material such as silicon oxide, and may have a thickness in a range from 100 nm to 600 nm, such as from 200 nm to 4000 nm, although lesser and greater thicknesses may also be used. Interconnection via structures (198, 196) may be formed through the via level dielectric layer 80. The interconnection via structures (198, 196) may include bit line interconnection via structures 198 that contact a top surface of a respective one of the drain contact via structures 88, word line interconnection via structures 196 that contact a top surface of a respective one of the word line contact via structures 86, and additional interconnection via structures (not shown) such as interconnection via structures that contact a respective one of the backside contact via structures 76.

A line level dielectric layer 90 is deposited over the via level dielectric layer 80. Various metal line structures (98, 96, 93, 97) are formed in the line level dielectric layer 90. The various metal line structure (98, 96, 93, 97) include bit lines 98 that are electrically connected to a respective plurality of the drain contact via structures 88, word-line-connection metal interconnect lines 96 that are electrically connected to a respective one of the word line contact via structures 86, source-contact-interconnection metal interconnect lines 93 that are electrically connected to the backside contact via structures 76, and peripheral metal interconnect lines 97 that are electrically connected to peripheral conductive via structures 197 (shown in FIG. 16A) extending through the retro-stepped dielectric material portion 65.

A subset of the electrically conductive layers 46 include word lines for the memory stack structures 55 located within a respective memory opening fill structure 58. The word lines may be laterally bounded by a pair of backside trenches 79 along the memory die horizontal direction mdhd2. The backside trenches 79 may laterally extend along the first memory die horizontal direction mdhd1 within each memory die 2000 with a uniform width. The word lines comprising a subset of the electrically conductive layers 46 may laterally extend along the first memory die horizontal direction mdhd1 with a uniform width along the second memory die horizontal direction mdhd2 within each memory die 2000. The bit lines 98 may laterally extend along the second memory die horizontal direction mdhd2.

The metallic materials in the backside contact via structure 76 and the electrically conductive layers 46 may generate mechanical stress, such as compressive stress, in the exemplary structure. The mechanical stress generated from the backside contact via structure 76 and the electrically conductive layers 46 is applied to surrounding structures of the exemplary structure primarily along the lengthwise direction of the backside contact via structure 76 and the electrically conductive layers 46. According to an embodiment of the present disclosure, suppression of distortion of the exemplary structure along the lengthwise directions of the backside contact via structure 76 and the electrically conductive layers 46 may be achieved by selecting the crystallographic orientations of the first single crystalline semiconductor substrate (9, 10) such the crystallographic direction along the lengthwise directions of the backside contact via structure 76 and the electrically conductive layers 46 provides a high Young's modulus and a low Poisson's ratio.

The backside contact via structures 76 laterally extend along the first memory die horizontal direction mdhd1, which is a first <110> direction of the set of first crystallographic orientations of the first single crystalline semiconductor substrate (9, 10). In the layout illustrated in FIG. 1B, the first memory die horizontal direction mdhd1 within each memory die 2000 corresponds to the [110] direction and the second memory die horizontal direction mdhd2 within each memory die corresponds to the [1 −1 0] direction. In the layout illustrated in FIG. 1C, the first memory die horizontal direction mdhd1 within each memory die 2000 corresponds to the [1 −1 0] direction and the second memory die horizontal direction mdhd2 within each memory die corresponds to the [110] direction. The <110> directions of single crystalline semiconductor materials, such as single crystalline silicon or a single crystalline silicon-germanium alloy, is resistant to deformation due to high Young's modulus. For example, Young's modulus of silicon along the <110> directions is 170 GPa, while Young's modulus along the <100> directions is 129 GPa. Further, the Poisson's ratio for silicon along the <110> directions is about 0.07, while the Poisson's ratio for silicon along the <100> directions is about 0.28. Thus, alignment of the lengthwise direction of the backside contact via structure 76 and the electrically conductive layers 46 along a <110> direction of the crystallographic orientations of the first single crystalline semiconductor substrate (9, 10) minimizes deformation of the memory die 2000.

Figure 14:
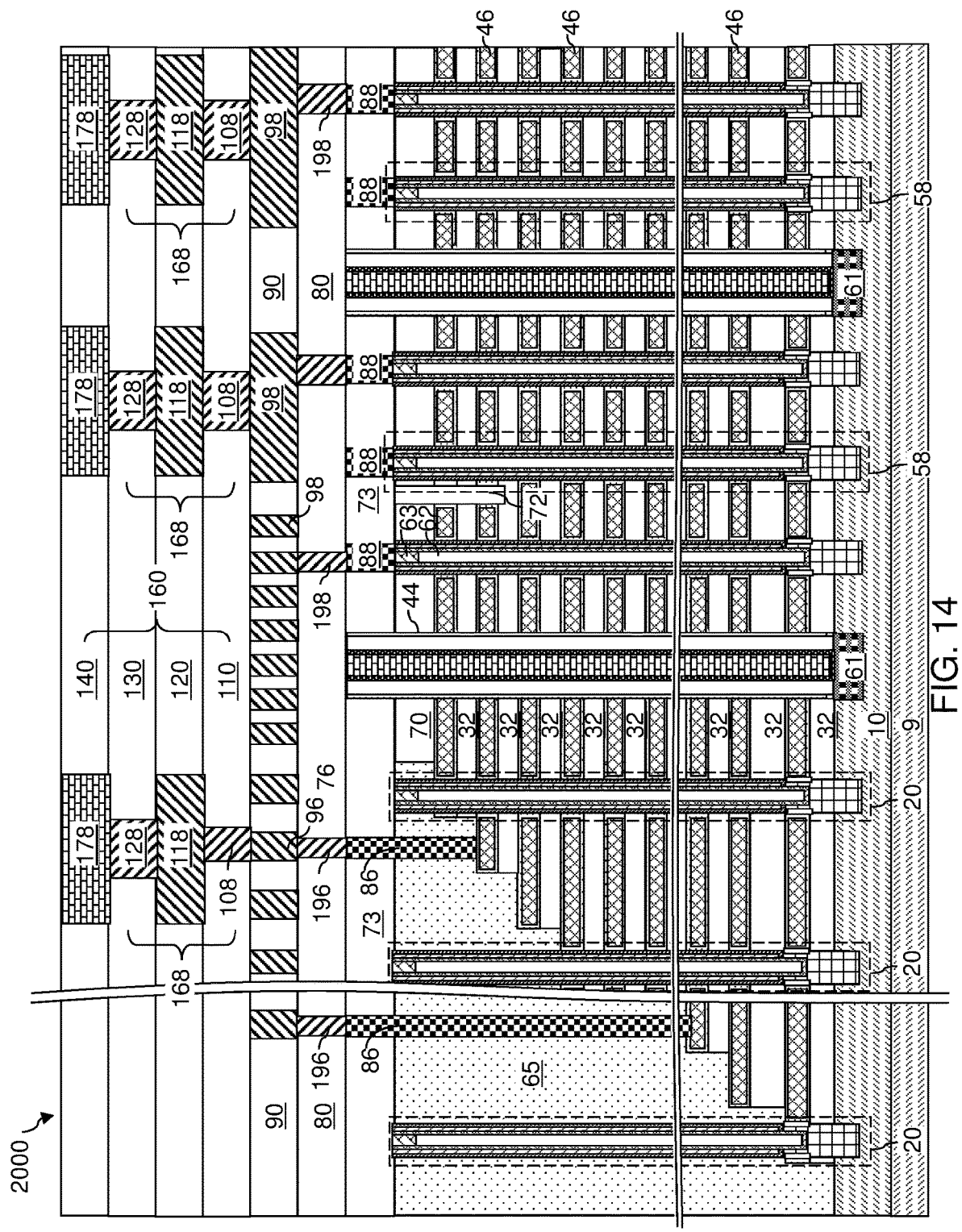
FIG. 14 is a schematic vertical cross-sectional view of a memory die after formation of first bonding pads according to an embodiment of the present disclosure.

Referring to FIG. 14, memory-side metal interconnect structures 168 may be formed within memory-side dielectric material layers 160. In an illustrative example, the memory-side dielectric material layers 160 may include a first via level dielectric layer 110, a second line level dielectric layer 120, a second via level dielectric layer 130, and a metallic pad structure level dielectric layer 140. The memory-side metal interconnect structures 168 may include first metal via structures 108 formed within the first via level dielectric layer 110, second metal line structures 118 formed within the second line level dielectric layer 120, and second metal via structures 128 formed within the second via level dielectric layer 130. Metallic pad structures 178 formed within the metallic pad structure level dielectric layer 140 may contact a top surface of a respective one of the second metal via structures 128. While the present disclosure is described using an example in which the memory-side dielectric material layers 160 include the first via level dielectric layer 110, the second line level dielectric layer 120, the second via level dielectric layer 130, and the metallic pad structure level dielectric layer 140, embodiments are expressly contemplated herein in which the memory-side dielectric material layers 160 include a different number and/or different combinations of dielectric material layers. Each memory die 2000 includes a three-dimensional array of first memory elements. Electrical connection paths may be provided by each combination of a metallic pad structure 178 and a contiguous set of metal interconnect structures {(196, 96, 108, 118, 128), or (198, 98, 108, 118, 128)}.

Each memory die 2000 may include a three-dimensional memory array. In one embodiment, the three-dimensional memory array comprises a monolithic three-dimensional NAND memory array. The electrically conductive layers 46 may comprise, or may be electrically connected to, a respective word line of the monolithic three-dimensional NAND memory array. The first single crystalline semiconductor substrate (9, 10) may comprise a silicon substrate. The vertical NAND memory array may comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings may be located over another memory cell (comprising another portion of the charge storage layer 54 at a level of another electrically conductive layer 46) in a second device level of the array of monolithic three-dimensional NAND strings. The silicon substrate may contain an integrated circuitry comprising a driver circuitry (comprising a subset of the least one semiconductor device 700) for the memory device located thereon. The electrically conductive layers 46 may comprise a plurality of control gate electrodes having a strip shape extending substantially parallel to the top surface of the first single crystalline semiconductor substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings may comprise: a plurality of semiconductor channels (59, 11, 60), wherein at least one end portion 60 of each of the plurality of semiconductor channels (59, 11, 60) extends substantially perpendicular to a top surface of the first single crystalline semiconductor substrate (9, 10) and comprising a respective one of the vertical semiconductor channels 60; and a plurality of charge storage elements (comprising portions of the memory films 50, i.e., portions of the charge storage layer 54). Each charge storage element may be located adjacent to a respective one of the plurality of semiconductor channels (59, 11, 60).

The three-dimensional memory array comprises word lines that laterally extend along a first memory die horizontal direction mdhd1 and bit lines laterally extending along a second memory die horizontal direction mdhd2. The first single crystalline semiconductor substrate (9, 10) has a set of first crystallographic orientations such that a <100> direction of the set of first crystallographic orientations is perpendicular to a planar top surface of the first single crystalline semiconductor substrate (9, 10), a first <110> direction of the set of first crystallographic orientations is parallel to the first memory die horizontal direction mdhd1, and a second <110> direction of the set of first crystallographic orientations is parallel to the second memory die horizontal direction mdhd2. The planar top surface of the first single crystalline semiconductor substrate (9, 10) may be parallel to a {100} plane for the set of first crystallographic orientations.

The three-dimensional memory array comprises alternating stacks of insulating layers 32 and electrically conductive layers 46. The alternating stacks are laterally spaced apart along the second memory die horizontal direction mdhd2, and the electrically conductive layers 46 comprise the word lines. The memory stack structures 55 extend through a respective one of the alternating stacks (32, 46). Each of the memory stack structures 55 comprises a respective vertical semiconductor channel 60 and a respective vertical stack of memory elements (comprising portions of charge storage layer 54) located adjacent to the respective vertical semiconductor channel 60 at levels of the electrically conductive layers 46. The alternating stacks (32, 46) comprise stepped surfaces located in a staircase region. Each electrically conductive layer 46 other than topmost ones of the electrically conductive layers 46 of the alternating stacks (32, 46) laterally extends farther than an overlying one of the electrically conductive layers 46. Word line contact via structures 86 contact a respective one of the electrically conductive layers 46 in the staircase region.

Each memory die 2000 comprises memory-side metal interconnect structures 168 formed within memory-side dielectric material layers 160 and electrically connecting the nodes of the three-dimensional memory array to a metallic pad structure 178, which is also referred to as a first bonding pad.

Figure 15A:
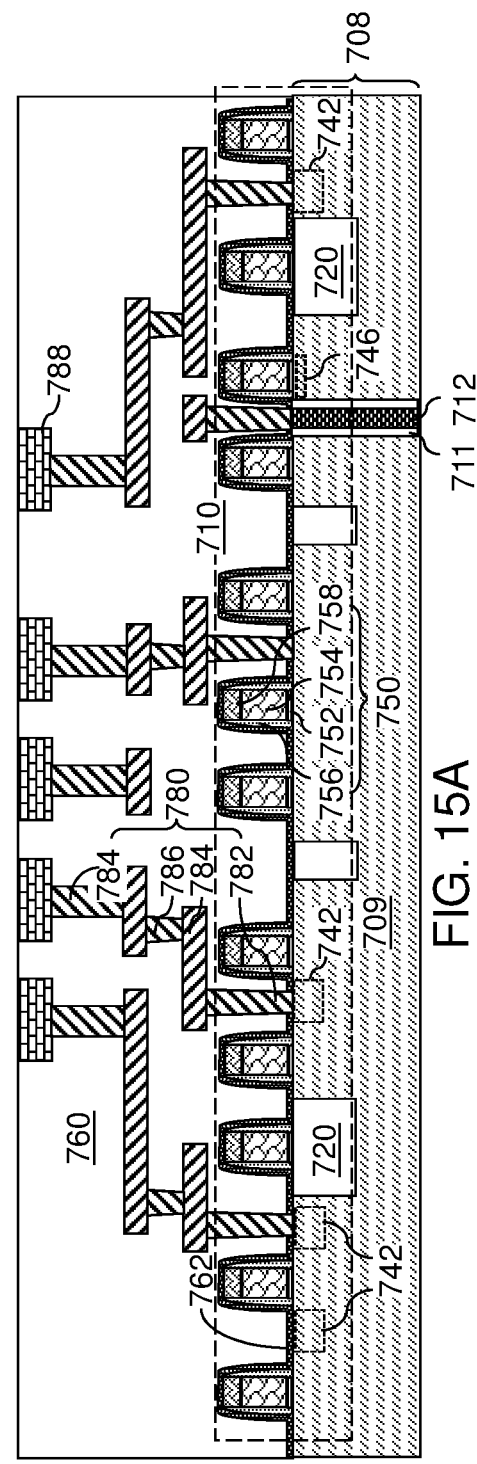
FIG. 15A is a vertical cross-sectional view of a logic die formed by dicing a second single crystalline semiconductor substrate and device structures formed thereupon according to an embodiment of the present disclosure.
Figure 15B:
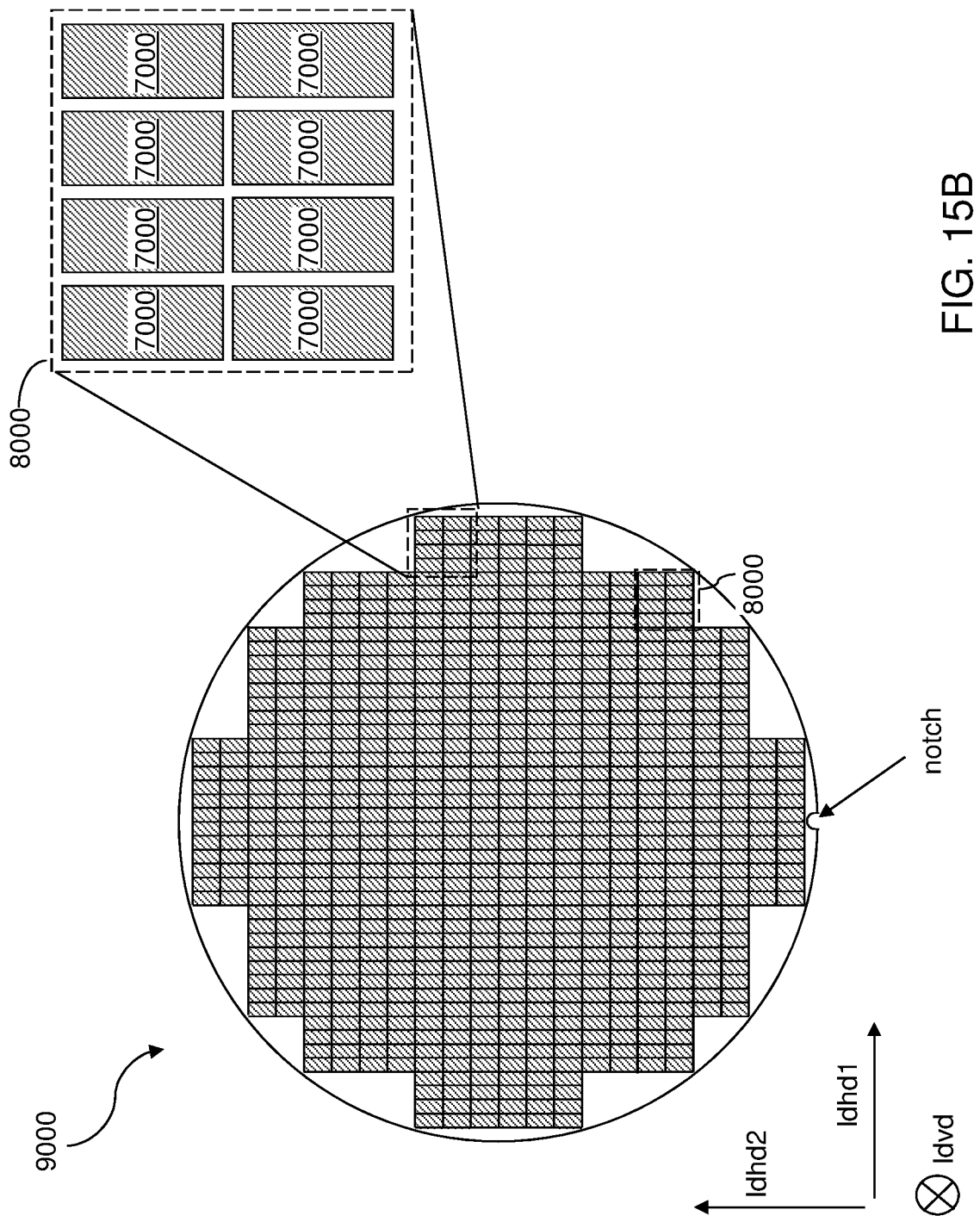
FIG. 15B is a plan view of exemplary exposure fields on the second single crystalline semiconductor substrate according to an embodiment of the present disclosure.
Figure 15C:
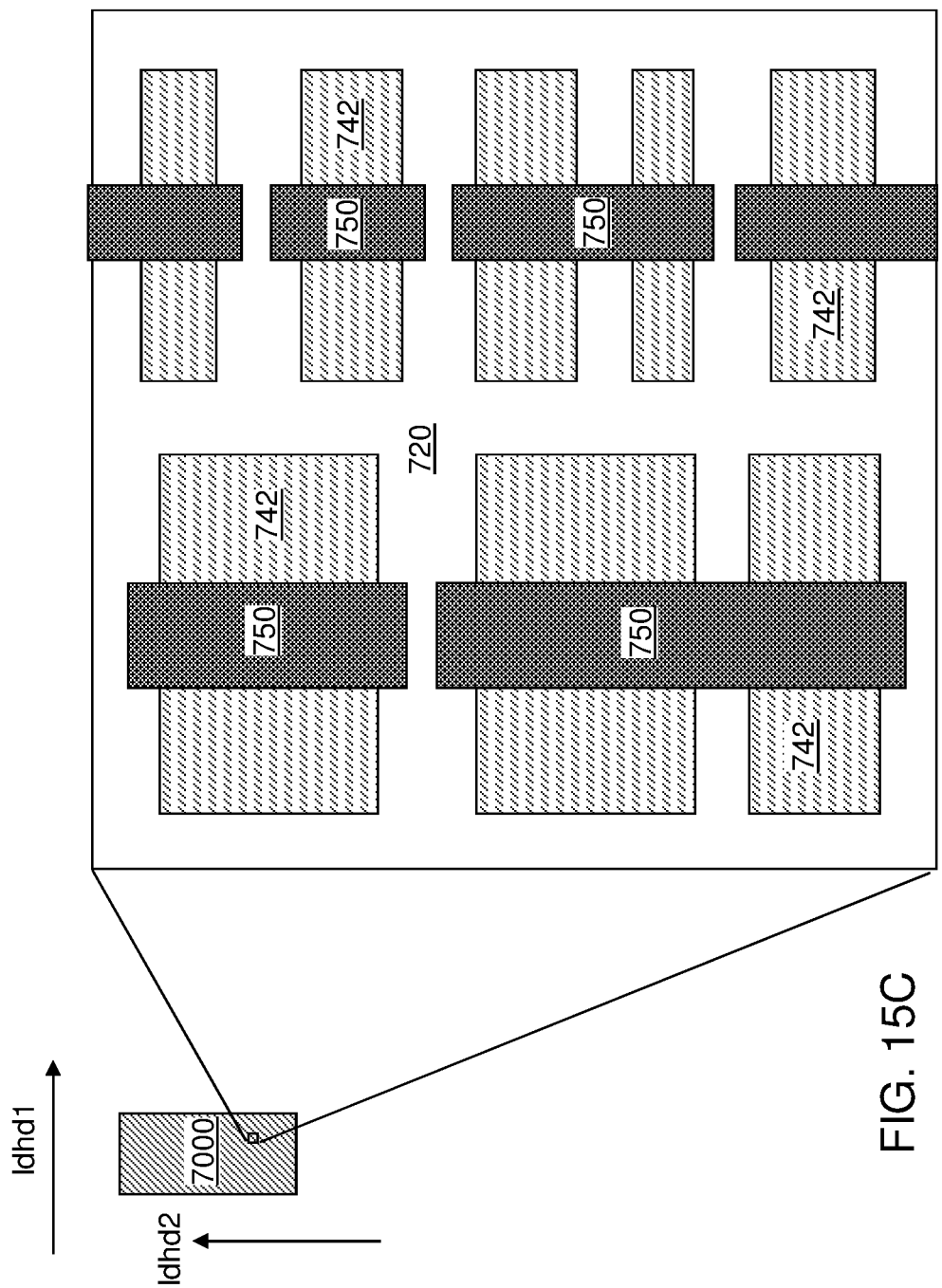
FIG. 15C is a plan view of a first exemplary device layout within the logic die of FIG. 15A according to an embodiment of the present disclosure.
Figure 15D:
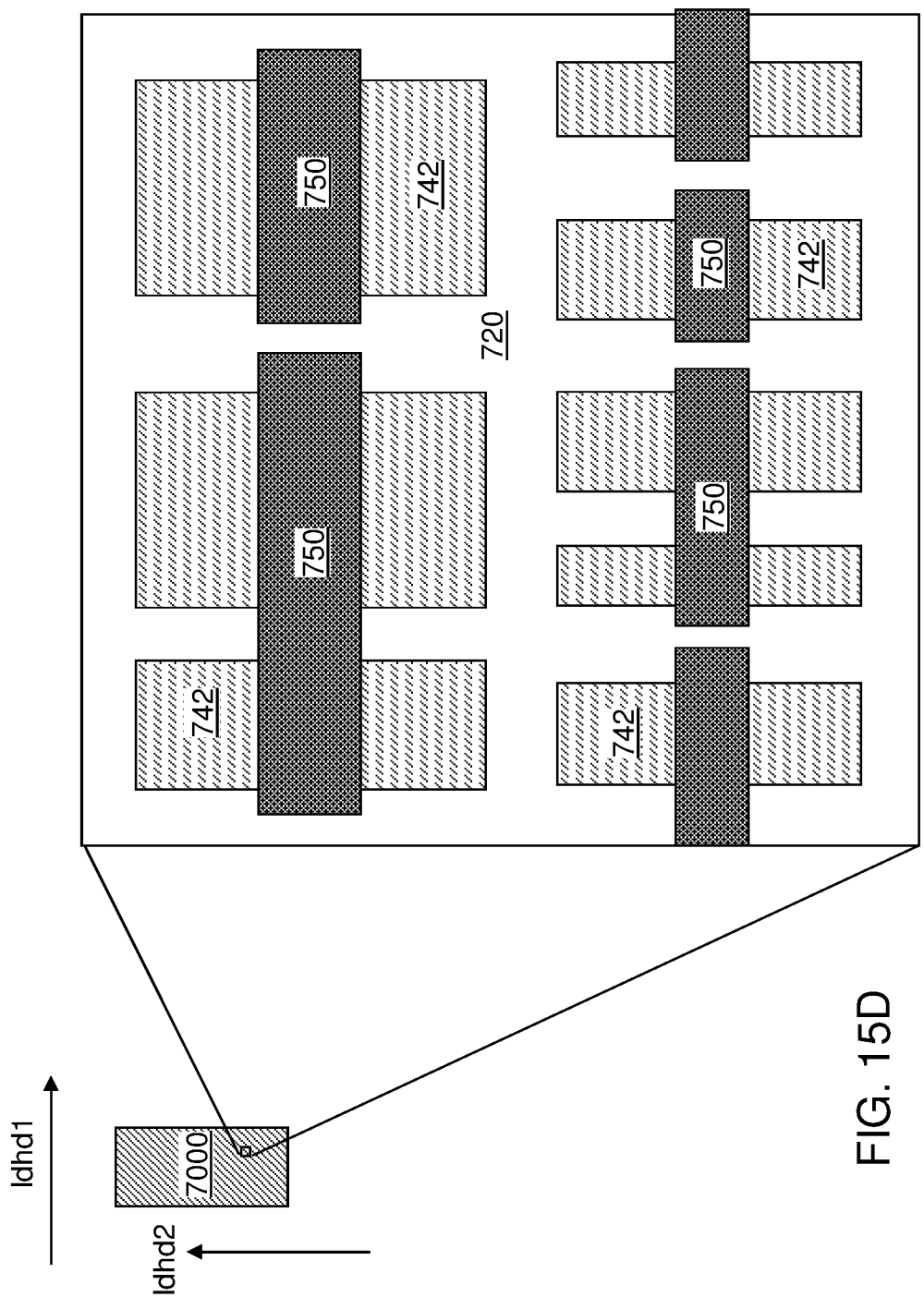
FIG. 15D is a plan view of a second exemplary device layout within the logic die of FIG. 15A according to an embodiment of the present disclosure.

Referring to FIGS. 15A-15D, a wafer 9000 including a plurality of logic dies 7000 is illustrated prior to dicing the wafer 9000. The wafer 9000 includes a second single crystalline semiconductor substrate 708. The second single crystalline semiconductor substrate 708 may include a single crystalline semiconductor material layer 709. FIG. 15A is a vertical cross-sectional view of one of the logic dies 7000. FIG. 15B illustrates the wafer 9000 with a layout of a plurality of exposure fields 8000 to be used on the wafer 9000 to form a plurality of logic dies 7000. FIG. 15C illustrates a first exemplary layout for field effect transistors within a logic die 7000, and FIG. 15D illustrates a second exemplary layout for field effect transistors within a logic die 7000. Upon completion of all processing sequences for forming the logic dies 7000 on the second single crystalline semiconductor substrate 708, the second single crystalline semiconductor substrate 708 may be diced to form a plurality of logic dies 7000.

The logic dies 7000 may be formed with a respective rectangular shape. Specifically, the logic dies 7000 may be formed with a pair of sides that are parallel to the x-direction (i.e., the horizontal direction that is perpendicular to the direction connecting the geometrical center of the wafer 9000 to the notch) of the wafer 9000 and a pair of sides that are parallel to the y-direction (i.e., the direction connecting the geometrical center of the wafer 9000 to the notch) of the wafer 9000. In this case, each exposure field 8000 corresponds to the area of the wafer 9000 that is lithographically exposed during a single illumination step in a lithographic exposure tool. In case the logic dies 7000 are manufactured using lithographic exposure and development processes, each exposure field 8000 may correspond to the area of a single logic die 7000, or may correspond to the area of a plurality of logic dies 7000. In one embodiment, the exposure fields 8000 may be arranged as a subset of a rectangular array such that the exposure fields 8000 are arranged as rows and columns that fit within the area of the wafer 9000. The rows and columns of the rectangular array may be arranged along the x-direction and the y-direction. During each lithographic exposure process, a photoresist layer may be applied over the wafer 9000 and each exposure field 8000 may be sequentially lithographically exposed. Upon completion of lithographic exposure of all exposure fields 8000, the photoresist layer may be developed to generate a pattern in the developed photoresist layer. A suitable processing step such as an etch step, a deposition step, and/or an ion implantation step may be performed using the patterned photoresist layer. Generally, a sequence of processing steps including deposition steps, lithographic patterning steps, and etch steps may be used to form the logic dies 7000.

In an illustrative example, each logic die 7000 may include a respective portion of the second single crystalline semiconductor substrate 708. Shallow trench isolation structures 720 may be formed in an upper portion of the second single crystalline semiconductor substrate 708 to provide electrical isolation from semiconductor devices 710 formed on the second single crystalline semiconductor substrate 708. The semiconductor devices 710 may include, for example, field effect transistors including respective transistor active regions 742 (i.e., source regions and drain regions), semiconductor channels 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, a logic circuitry, and/or a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Each logic die 7000 may include a peripheral circuitry (comprising a subset of the semiconductor devices 710) located on the second single crystalline semiconductor substrate 708. The logic die 7000 may comprise field effect transistors having semiconductor channels 746 configured to flow electrical current along a channel direction, i.e., a horizontal direction connecting a source region and a drain region of a respective field effect transistor. The second single crystalline semiconductor substrate 708 may be single crystalline, and may have a set of second crystallographic orientations, i.e., the set of all crystallographic orientations for the single crystalline semiconductor material of the second single crystalline semiconductor substrate 708.

Each logic die 7000 may include a pair of sides that are parallel to the x-direction (i.e., the horizontal direction that is perpendicular to the direction connecting the geometrical center of the wafer 9000 to the notch) and a pair of sides that are parallel to the y-direction (i.e., the direction connecting the geometrical center of the wafer 9000 to the notch). The direction within each logic die 7000 that is parallel to the x-direction is herein referred to as a first logic die horizontal direction ldhd1, and the direction with each logic die 7000 that is parallel to the y-direction is herein referred to as a second logic die horizontal direction ldhd2. The channel directions within each logic die 7000 may be parallel to the first logic die horizontal direction ldhd1 as illustrated in FIG. 15C, or may be parallel to the second logic die horizontal direction as illustrated in FIG. 15D.

According to an embodiment of the present disclosure, the channel directions of the field effect transistors within the logic dies 7000 may be selected such that the on-current of the field effect transistors is maximized without regard to deformations of the logic dies 7000 caused by mechanical stress. In one embodiment, a direction other than any <100> direction of the set of second crystallographic orientations is perpendicular to a planar top surface of the second single crystalline semiconductor substrate 708, or a direction other than any <110> direction of the set of second crystallographic orientations is parallel to the channel direction.

In one embodiment, a direction other than any <100> direction of the set of second crystallographic orientations is perpendicular to a planar top surface of the second single crystalline semiconductor substrate 708. In this case, the wafer 9000 is not a (100) substrate, and the planar top surface of the second single crystalline semiconductor substrate 708 is parallel to a {110} surface, a {111} surface, or a {551} surface for the set of second crystallographic orientations. Accordingly, the wafer may be a (110) wafer (i.e., a wafer having a {110} surface as a planar top surface), a (111) wafer (i.e., a wafer having a {111} surface as a planar top surface), or a (551) wafer (i.e., a wafer having a {551} surface as a planar top surface). The channel direction may be parallel to the x-direction or the y-direction. The channel direction may be, for example, a <100> direction, a <110> direction, or a <112> direction in case the wafer 9000 is a (110) wafer, a <110> direction or a <112> direction in case the wafer 9000 is a (111) wafer or a (551) wafer. In one embodiment, the channel direction is parallel to a <110> direction or a <112> direction of the set of second crystallographic orientations. In one embodiment, the wafer 9000 is a forty five degree (45°) notch wafer.

In one embodiment, a direction other than any <110> direction of the set of second crystallographic orientations is parallel to the channel direction. In this case, the planar top surface of the second single crystalline semiconductor substrate 708 may, or may not, be parallel to a {100} plane for the set of second crystallographic orientations. In one embodiment, the planar top surface of the second single crystalline semiconductor substrate 708 is parallel to a {100} plane for the set of second crystallographic orientations. In one embodiment, the channel direction may be parallel to a <100> direction selected from the set of second crystallographic orientations.

The charge carrier mobility is crystallographic orientation dependent in a single crystalline elemental semiconductor material. Generally, electron mobility is comparable along the <100> and <110> directions and the hole mobility is higher along the <100> directions. The set of second crystallographic orientations including the crystallographic direction that is perpendicular to the planar top surface of the second single crystalline semiconductor substrate 708 and the crystallographic direction parallel to the channel directions may be selected to provide high electron mobility for p-type field effect transistors or n-type field effect transistors.

In one embodiment, the semiconductor devices 710 within the logic die may include a peripheral circuitry. The peripheral circuitry may include a word line driver circuitry configured to drive the word lines (comprising a subset of the electrically conductive layers 46) in a memory die 2000, a bit line driver circuitry configured to drive the bit lines 98 in the memory die 2000, and a sense amplifier circuitry configured to sense states of memory elements within the three-dimensional memory array under bias conditions provided by the word line driver circuitry.

Dielectric material layers are formed over the semiconductor devices, which are herein referred to as logic-side dielectric material layers 760. A dielectric liner 762 (such as a silicon nitride liner that blocks diffusion of mobile ions and/or apply appropriate stress to underlying structures) may be provided directly on top surfaces of the field effect transistors underneath the logic-side dielectric material layers 760 to provide a diffusion barrier structure that prevents downward diffusion of hydrogen, moisture, and/or impurity atoms. Each dielectric material layer selected from the logic-side dielectric material layers 760 may include any of doped silicate glass, undoped silicate glass, organosilicate glass, silicon nitride, silicon oxynitride, and dielectric metal oxides (such as aluminum oxide). In one embodiment, the logic-side dielectric material layers 760 may comprise, or consist essentially of, dielectric material layers having dielectric constants that do not exceed the dielectric constant of undoped silicate glass (silicon oxide) of 3.9.

The logic-side dielectric material layers 760 function as a matrix for logic-side metal interconnect structures 780. The logic-side metal interconnect structures 780 provide electrical wiring to and from the various nodes of the semiconductor devices and landing pads for through-memory-level contact via structures to be subsequently formed. The logic-side metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and metallic pad structures 788 that are configured to function as second bonding pads for bonding with the first bonding pads (i.e., the metallic pad structures 178) of a memory die 2000. Each of the logic-side metal interconnect structures 780 may include a metallic nitride liner and a metal fill structure. Top surfaces of the metallic pad structures 788 and the topmost surface of the logic-side dielectric material layers 760 may be planarized by a planarization process, such as chemical mechanical planarization.

Optionally, the second single crystalline semiconductor substrate 708 may be thinned prior to dicing the second crystalline semiconductor substrate 708 and structures thereupon into a plurality of logic dies 7000. Optionally, at least one through-substrate via (TSV) structure 712 may be formed through the second single crystalline semiconductor substrate 708 in each logic die 7000. For example, the wafer 9000 may be disposed upside down, and a photoresist layer may be applied over the backside surface of the wafer 9000 and may be lithographically patterned to form openings therethrough. Through-substrate via cavities may be formed through the second single crystalline semiconductor substrate 708 underneath the openings in the photoresist layer by an anisotropic etch process. The photoresist layer may be removed, for example, by ashing. A through-substrate insulating spacer 711 may be formed at the periphery of each through-substrate via cavity by deposition and an anisotropic etch of a conformal insulating material layer such as a silicon oxide layer. A conductive material may be deposited within each remaining volume of the through-substrate via cavities to form the through-substrate via structures 712. Each combination of a through-substrate insulating spacer 711 and a through-substrate via structure constitutes a laterally-insulated through substrate via structures (711, 712).

Each logic die 7000 comprises second bonding pads (i.e., the metallic pad structures 788) electrically connected to nodes of the peripheral circuitry. Each logic die 7000 comprises logic-side metal interconnect structures 780 formed within the logic-side dielectric material layers 760 and electrically connecting the nodes of the peripheral circuitry to the second bonding pads. A plurality of laterally-insulated through substrate via structures (711, 712) may extend through the second single crystalline semiconductor substrate 708. The logic die 7000 may be diced from the wafer 9000 by cutting the wafer 9000 along dicing channels that are parallel to the x-direction or the y-direction and located between each neighboring pair of logic dies 7000.

Figure 16A:
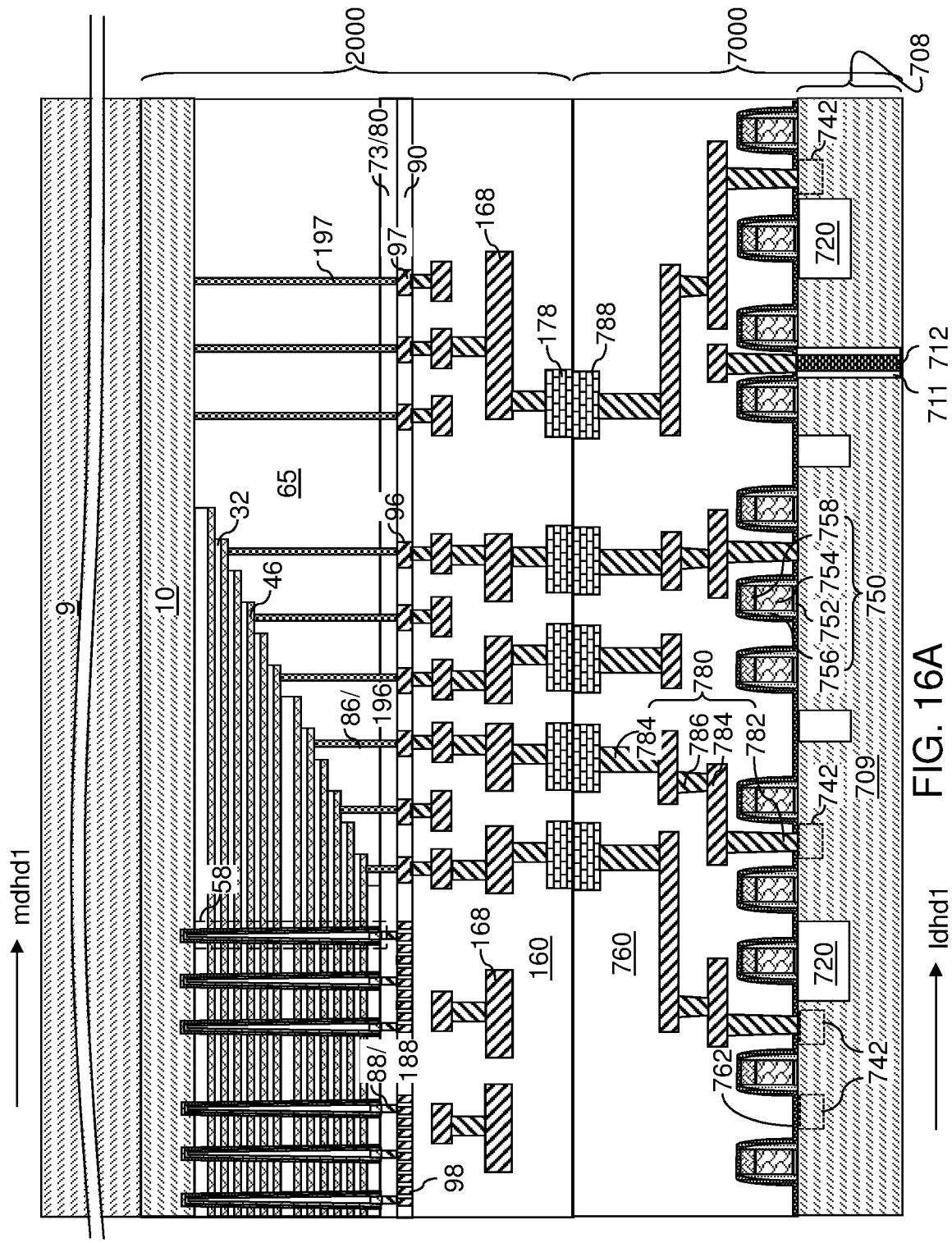
FIG. 16A is a vertical cross-sectional view of an exemplary bonded assembly according to an embodiment of the present disclosure.
Figure 16B:
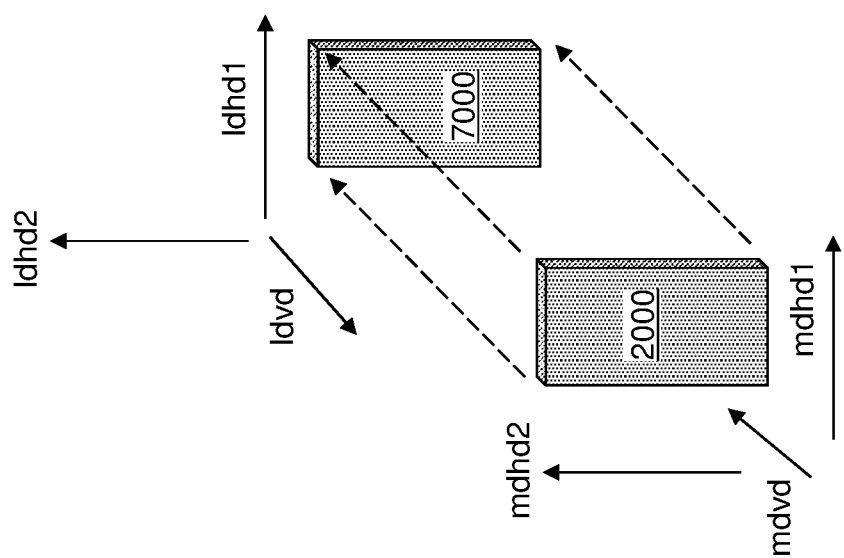
FIG. 16B is a perspective view illustrating the orientational relationships between various crystallographic orientations of the first and second single crystalline semiconductor substrates according to an embodiment of the present disclosure.

Referring to FIGS. 16A and 16B, a memory die 2000 and a logic die 7000 may be selected for bonding, and may be positioned such that each first bonding pad (comprising metallic pad structures 178) of the memory die 2000 faces, and is aligned to, a respective second bonding pad (comprising metallic pad structures 788). The vertical direction (z-direction) mdvd of the memory die 2000 may be aligned antiparallel to the vertical direction ldvd of the logic die 7000. According to an embodiment of the present disclosure, the first memory die horizontal direction mdhd1 of the memory die 2000 may be aligned to one of the first logic die horizontal direction ldhd1 and the second logic die horizontal direction ldhd2 of the logic die 7000, and the second memory die horizontal direction mdhd2 of the memory die 2000 may be aligned to another of the first logic die horizontal direction ldhd1 and the second logic die horizontal direction ldhd2. Thus, the channel direction of field effect transistors in the logic die 7000 is parallel to the first memory die horizontal direction mdhd1 or the second memory die horizontal direction mdhd2. Peripheral conductive via structures 197 extending through the retro-stepped dielectric material portion 65 and contacting the peripheral metal interconnect lines 97 are expressly shown.

The memory die 2000 and the logic die 7000 are subsequently bonded to form a bonded assembly. Each first bonding pad (comprising metallic pad structures 178) of the memory die 2000 is bonded to a respective second bonding pad (comprising metallic pad structures 788). In one embodiment, metal-to-metal bonding such as copper-to-copper bonding may be used to directly bond the first bonding pads to the second bonding pads. In another embodiment, an array of solder material portions (such as solder balls) may be used to bond the first bonding pads to the second bonding pads.

In one embodiment, the memory die 2000 comprises a pair of first memory die sidewalls that are parallel to the first memory die horizontal direction mdhd1 and a pair of second memory die sidewalls that are parallel to the second memory die horizontal direction mdhd2. The logic die 7000 comprises a pair of first logic die sidewalls that are parallel to, or perpendicular to, the channel direction and a pair of second logic die sidewalls that are perpendicular to, or parallel to, the channel direction. The logic die 7000 and the memory die 2000 may be bonded such that the pair of first memory die sidewalls is parallel to the pair of first logic die sidewalls, and the pair of second memory die sidewalls is parallel to the pair of second logic die sidewalls. The channel direction of the logic die 7000 is parallel to the first memory die horizontal direction or to the second memory die horizontal direction.

Thus, in one embodiment, a method for forming a bonded assembly includes providing at least one memory die 2000 including a three-dimensional memory array located on a zero degree notch single crystalline silicon wafer 4000, providing at least one logic die 7000 including a peripheral circuitry located on a forty five degree notch single crystalline silicon wafer 9000, and bonding the at least one logic die 7000 to the at least one memory die 2000.

In one embodiment, the bonding step may be carried out after one and/or both of the zero degree notch single crystalline silicon wafer 4000 and/or the forty five degree notch single crystalline silicon wafer 9000 are diced to form a plurality of the memory die 2000 and the logic die 7000, followed by bonding at least one memory die 2000 to at least one logic die 7000 to form the bonded assembly.

Alternatively, the bonding step may be carried out before one and/or both of the zero degree notch single crystalline silicon wafer 4000 and/or the forty five degree notch single crystalline silicon wafer 9000 are diced to form the bonded assembly, followed by dicing one and/or both of the zero degree notch single crystalline silicon wafer 4000 and/or the forty five degree notch single crystalline silicon wafer 9000 to form a plurality of diced memory die 2000 bonded to one or more respective diced logic die 7000.

Figure 17:
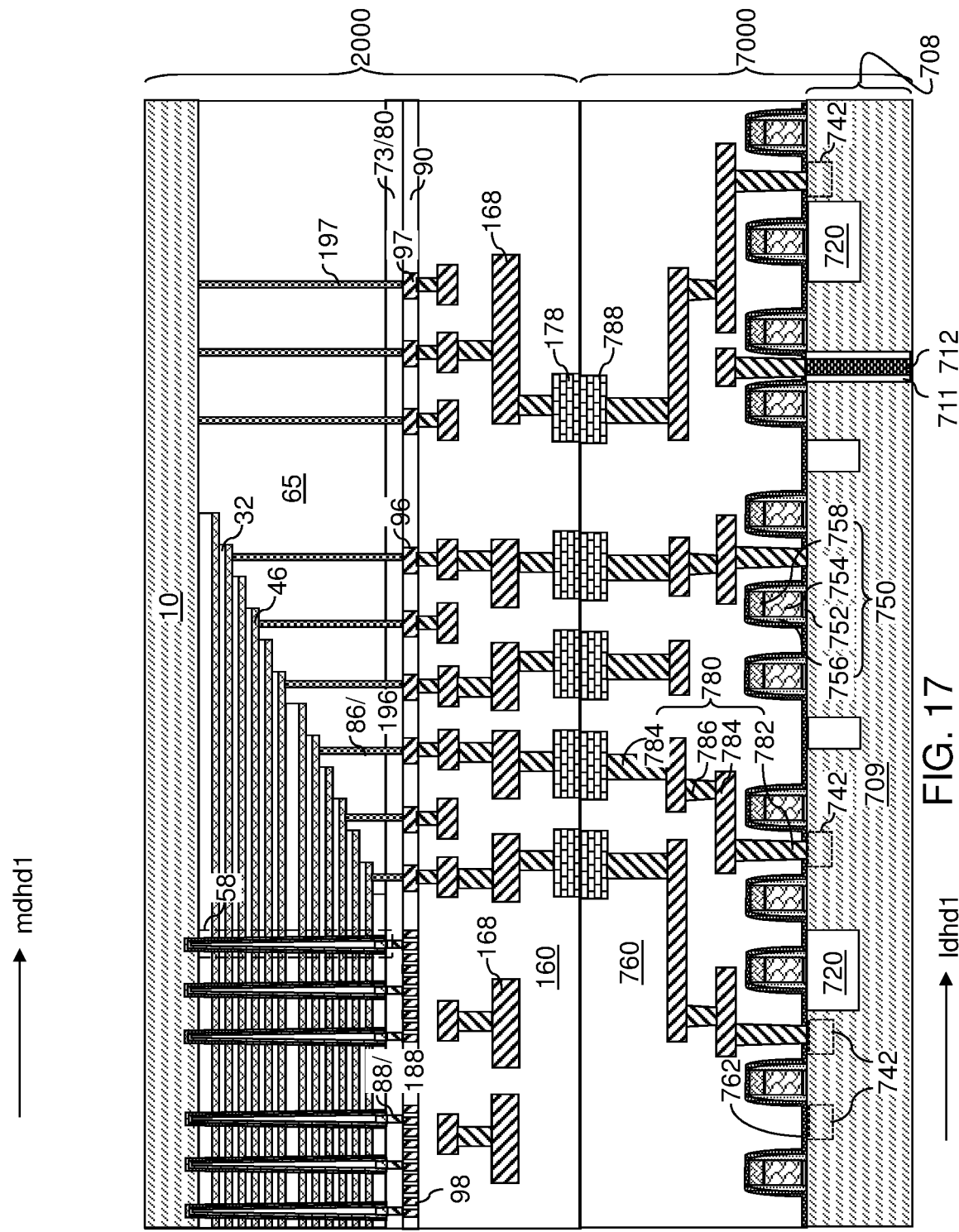
FIG. 17 is a vertical cross-sectional view of the exemplary bonded assembly after removing a carrier substrate portion from the second single crystalline semiconductor substrate according to an embodiment of the present disclosure.

Referring to FIG. 17, the bulk semiconductor substrate portion 9 may be removed from the backside of the memory die 2000, for example, by grinding. The semiconductor material layer 10 remains on the backside of the memory die 2000 after removal of the bulk semiconductor substrate portion 9. The thickness of the semiconductor material layer 10 may be in a range from 2 microns to 100 microns.

Figure 18:
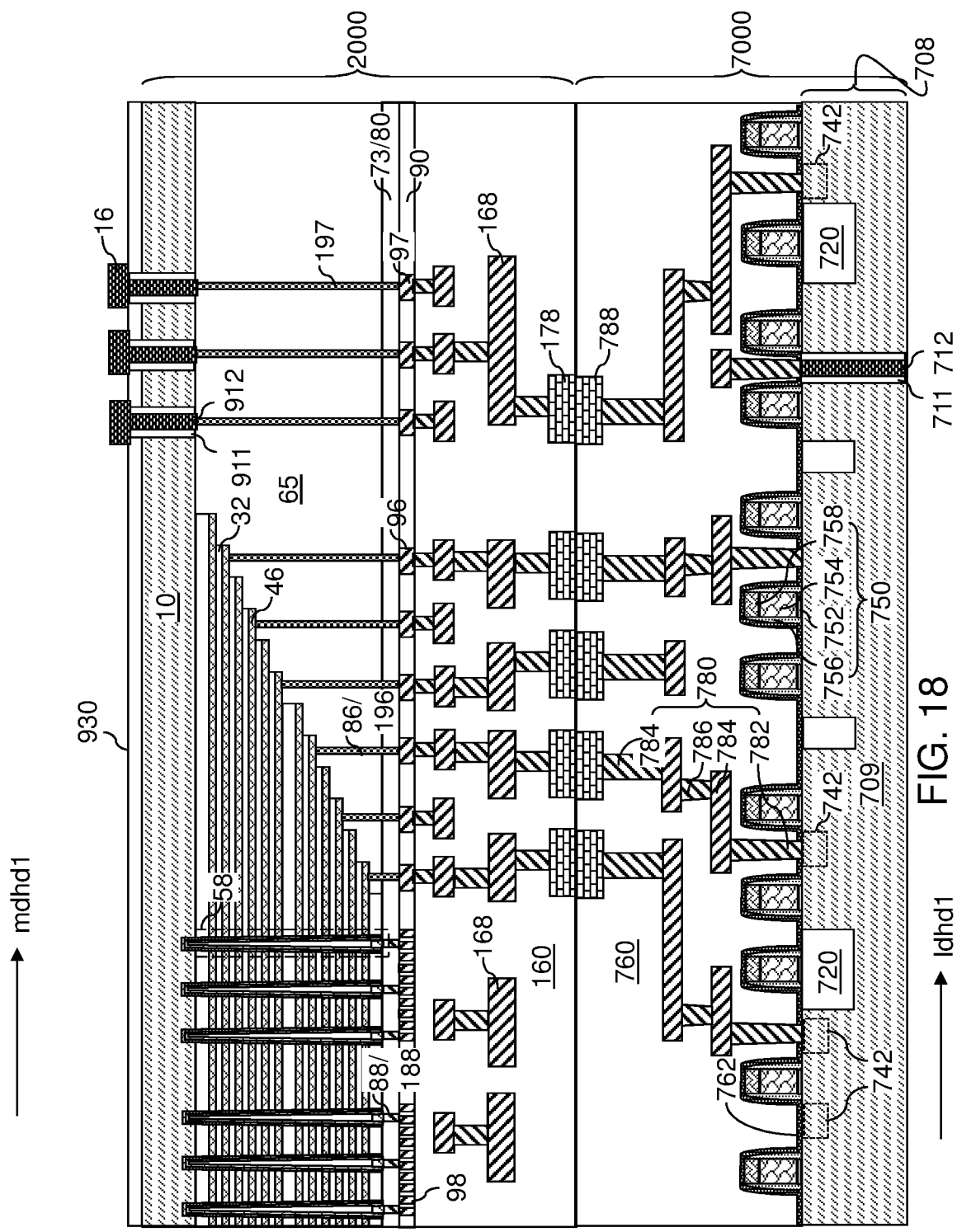
FIG. 18 is a vertical cross-sectional view of the exemplary bonded assembly after formation of laterally-insulated through substrate via structures through the first single crystalline semiconductor substrate according to an embodiment of the present disclosure.

Referring to FIG. 18, a backside insulating layer 930 may be optionally formed on the physically exposed surface of the semiconductor material layer 10. The backside insulating layer 930 includes a dielectric material such as silicon oxide and/or silicon nitride, and may have a thickness in a range from 100 nm to 500 nm, although lesser and greater thicknesses may also be used.

Optionally, at least one through-substrate via (TSV) structure 912 may be formed through the semiconductor material layer 10 of the memory die 2000. Through-substrate via cavities may be formed through the semiconductor material layer 10 by forming a patterned photoresist layer over the backside insulating layer 930 and by performing an anisotropic etch process. The photoresist layer may be removed, for example, by ashing. A through-substrate insulating spacer 911 may be formed at the periphery of each through-substrate via cavity by deposition and an anisotropic etch of a conformal insulating material layer such as a silicon oxide layer. A conductive material may be deposited within each remaining volume of the through-substrate via cavities to form the through-substrate via structures 912. The through-substrate via structures 912 may be formed on an end surface of a respective one of the peripheral conductive via structures 197 located at an interface between the retro-stepped dielectric material portion 65 and the semiconductor material layer 10. Each combination of a through-substrate insulating spacer 911 and a through-substrate via structure constitutes a laterally-insulated through substrate via structures (911, 912). An external bonding pad 16 may be formed on each of the laterally-insulated through substrate via structures (911, 912) through the semiconductor material layer 10 and/or each of the laterally-insulated through substrate via structures (911, 912) through the second single crystalline semiconductor substrate 708.

Referring to all drawings and according to various embodiments of the present disclosure, a bonded assembly is provided, which comprises: a memory die 2000 including a three-dimensional memory array located on a first single crystalline semiconductor substrate (which may comprise the semiconductor material layer 10); and a logic die 7000 including a peripheral circuitry located on a second single crystalline semiconductor substrate 708 and bonded to the memory die 2000, wherein: the three-dimensional memory array comprises word lines (comprising electrically conductive layers 46) that laterally extend along a first horizontal direction (such as the first memory device horizontal direction mdhd1) and bit lines 98 laterally extending along a second horizontal direction (such as the second memory device horizontal direction mdhd2); the logic die 7000 comprises field effect transistors having semiconductor channels configured to flow electrical current along a channel direction selected from the first horizontal direction and the second horizontal direction; the first single crystalline semiconductor substrate has a set of first crystallographic orientations such that a <100> direction of the set of first crystallographic orientations is parallel to a vertical direction, a first <110> direction of the set of first crystallographic orientations is parallel to the first horizontal direction, and a second <110> direction of the set of first crystallographic orientations is parallel to the second horizontal direction; and the second single crystalline semiconductor substrate 708 has a set of second crystallographic orientations such that a direction other than any <100> direction of the set of second crystallographic orientations is parallel to the vertical direction or a direction other than any <110> direction of the set of second crystallographic orientations is parallel to one of the first horizontal direction and the second horizontal direction.

In one embodiment, the memory die 2000 comprises a pair of first memory die sidewalls that are parallel to the first horizontal direction and a pair of second memory die sidewalls that are parallel to the second horizontal direction; and the logic die comprises a pair of first logic die sidewalls that are parallel to the first horizontal direction and a pair of second logic die sidewalls that are parallel to the second horizontal direction.

In one embodiment, the first single crystalline semiconductor substrate comprises a first planar top surface and a first planar bottom surface that are parallel to a {100} plane for the set of first crystallographic orientations.

In one embodiment, wherein the second single crystalline semiconductor substrate 708 comprises a second planar top surface and a second planar bottom surface that are parallel to a {100} plane for the set of second crystallographic orientations. In one embodiment, the channel direction is parallel to a <100> direction selected from the set of second crystallographic orientations.

In one embodiment, the second single crystalline semiconductor substrate comprises a second planar top surface and a second planar bottom surface that are parallel to a {110} surface, a {111} surface, or a {551} surface for the set of second crystallographic orientations. In one embodiment, the channel direction is parallel to a <110> direction or a <112> direction of the set of second crystallographic orientations.

In one embodiment, the peripheral circuitry comprises: a word line driver circuitry configured to drive the word lines in the memory die; a bit line driver circuitry configured to drive the bit lines in the memory die; and a sense amplifier circuitry configured to sense states of memory elements within the three-dimensional memory array under bias conditions provided by the word line driver circuitry.

In one embodiment, the memory die 2000 comprises: alternating stacks of insulating layers 32 and electrically conductive layers 46, wherein the alternating stacks (32, 46) are laterally spaced apart along the second horizontal direction, and the electrically conductive layers 46 comprise the word lines; and memory stack structures 55 extending through a respective one of the alternating stacks (32, 46), wherein each of the memory stack structures 55 comprises a respective vertical semiconductor channel 60 and a respective vertical stack of memory elements located adjacent to the respective vertical semiconductor channel 60 at levels of the electrically conductive layers 46.

In one embodiment, the alternating stacks (32, 46) comprises stepped surfaces located in a staircase region, wherein each electrically conductive layer 46 other than topmost ones of the electrically conductive layers 46 of the alternating stacks (32, 46) laterally extends farther than an overlying one of the electrically conductive layers 46; and word line contact via structures 86 contact a respective one of the electrically conductive layers 46 in the staircase region.

In one embodiment, the memory die 2000 comprises first bonding pads (comprising metallic pad structures 178) electrically connected to nodes of the three-dimensional memory array; the logic die comprises second bonding pads (comprising metallic pad structures 788) electrically connected to nodes of the peripheral circuitry; and the first bonding pads are bonded to the second bonding pads.

In one embodiment, the memory die 2000 comprises memory-side metal interconnect structures 168 formed within memory-side dielectric material layers 160 and electrically connecting the nodes of the three-dimensional memory array to the first bonding pads; the logic die 7000 comprises logic-side metal interconnect structures 780 formed within logic-side dielectric material layers 760 and electrically connecting the nodes of the peripheral circuitry to the second bonding pads; and the bonded assembly comprises a plurality of laterally-insulated through substrate via structures {(711, 712), (911, 912)} that extend through one of the first single crystalline semiconductor substrate and the second single crystalline semiconductor substrate 708.

The memory die 2000 within the bonded assembly may include a three-dimensional memory device. In one embodiment, the three-dimensional memory device comprises a monolithic three-dimensional NAND memory device. The electrically conductive layers 46 may comprise, or may be electrically connected to, a respective word line of the monolithic three-dimensional NAND memory device. The first single crystalline semiconductor substrate (9, 10) may comprise a silicon substrate. The vertical NAND memory device may comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings may be located over another memory cell (comprising another portion of the charge storage layer 54 at a level of another electrically conductive layer 46) in a second device level of the array of monolithic three-dimensional NAND strings. The silicon substrate may contain an integrated circuitry comprising a driver circuitry (comprising a subset of the least one semiconductor device 700) for the memory device located thereon. The electrically conductive layers 46 may comprise a plurality of control gate electrodes having a strip shape extending substantially parallel to the top surface of the first single crystalline semiconductor substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings may comprise: a plurality of semiconductor channels (59, 11, 60), wherein at least one end portion 60 of each of the plurality of semiconductor channels (59, 11, 60) extends substantially perpendicular to a top surface of the first single crystalline semiconductor substrate (9, 10) and comprising a respective one of the vertical semiconductor channels 60; and a plurality of charge storage elements (comprising portions of the memory films 50, i.e., portions of the charge storage layer 54). Each charge storage element may be located adjacent to a respective one of the plurality of semiconductor channels (59, 11, 60).

Selection of different crystallographic directions for the sidewall directions of the memory die 2000 and for the sidewall directions of the logic die 7000 provides for the suppression of distortion of the memory die 2000 and performance enhancement of field effect transistors within the logic die 7000 within a bonded assembly including the logic die 7000 and the memory die 2000. Reduction in the deformation of the memory die 2000 facilitates bonding of the memory die 2000 to the logic die 7000, and provides for the utilization of high performance field effect transistors within the logic die 7000 as the peripheral circuitry for the three-dimensional memory array in the memory die 2000.

The various embodiment structures and methods for making the embodiment structures provide bonded assemblies comprising logic dies bonded to memory dies with improved performance and improved wafer warpage characteristics.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A bonded assembly comprising:
   a memory die including a three-dimensional memory array located on a first single crystalline semiconductor substrate; and
   a logic die bonded to the memory die and including a peripheral circuitry located on a second single crystalline semiconductor substrate,
   wherein:
   the three-dimensional memory array comprises word lines that laterally extend along a first horizontal direction and bit lines laterally extending along a second horizontal direction;
   the logic die comprises field effect transistors;
   the first single crystalline semiconductor substrate has a set of first crystallographic orientations such that a first direction of the set of first crystallographic orientations is parallel to a vertical direction; and
   the second single crystalline semiconductor substrate has a set of second crystallographic orientations such that a second direction of the set of second crystallographic orientations is parallel to the vertical direction, wherein the second direction is different from the first direction.

2. The bonded assembly of claim 1, wherein:
   the memory die comprises a pair of first memory die sidewalls that are parallel to the first horizontal direction and a pair of second memory die sidewalls that are parallel to the second horizontal direction; and
   the logic die comprises a pair of first logic die sidewalls that are parallel to the first horizontal direction and a pair of second logic die sidewalls that are parallel to the second horizontal direction.

3. The bonded assembly of claim 1, wherein:
   the transistors have semiconductor channels configured to flow electrical current along a channel direction selected from either the first horizontal direction or the second horizontal direction; and
   the first single crystalline semiconductor substrate comprises a first planar top surface and a first planar bottom surface that are parallel to a {100} plane for the set of first crystallographic orientations.

4. The bonded assembly of claim 3, wherein the second single crystalline semiconductor substrate comprises a second planar top surface and a second planar bottom surface that are parallel to a {100} plane for the set of second crystallographic orientations.

5. The bonded assembly of claim 4, wherein the channel direction is parallel to a <100> direction selected from the set of second crystallographic orientations.

6. The bonded assembly of claim 3, wherein the second single crystalline semiconductor substrate comprises a second planar top surface and a second planar bottom surface that are parallel to a {110} surface, a {111} surface, or a {551} surface for the set of second crystallographic orientations.

7. The bonded assembly of claim 6, wherein the channel direction is parallel to a <110> direction or a <112> direction of the set of second crystallographic orientations.

8. The bonded assembly of claim 1, wherein the peripheral circuitry comprises:
   a word line driver circuitry configured to drive the word lines in the memory die;
   a bit line driver circuitry configured to drive the bit lines in the memory die; and
   a sense amplifier circuitry configured to sense states of memory elements within the three-dimensional memory array under bias conditions provided by the word line driver circuitry.

9. The bonded assembly of claim 1, wherein the memory die comprises:
   alternating stacks of insulating layers and electrically conductive layers, wherein the alternating stacks are laterally spaced apart along the second horizontal direction, and the electrically conductive layers comprise the word lines; and
   memory stack structures extending through a respective one of the alternating stacks, wherein each of the memory stack structures comprises a respective vertical semiconductor channel and a respective vertical stack of memory elements located adjacent to the respective vertical semiconductor channel at levels of the electrically conductive layers.

10. The bonded assembly of claim 9, wherein:
    the alternating stacks comprise stepped surfaces located in a staircase region, wherein each electrically conductive layer other than topmost ones of the electrically conductive layers of the alternating stacks laterally extends farther than an overlying one of the electrically conductive layers; and
    word line contact via structures contact a respective one of the electrically conductive layers in the staircase region.

11. The bonded assembly of claim 1, wherein:
    the memory die comprises first bonding pads electrically connected to nodes of the three-dimensional memory array;
    the logic die comprises second bonding pads electrically connected to nodes of the peripheral circuitry; and
    the first bonding pads are bonded to the second bonding pads.

12. The bonded assembly of claim 11, wherein:
    the memory die comprises memory-side metal interconnect structures formed within memory-side dielectric material layers and electrically connecting the nodes of the three-dimensional memory array to the first bonding pads;
    the logic die comprises logic-side metal interconnect structures formed within logic-side dielectric material layers and electrically connecting the nodes of the peripheral circuitry to the second bonding pads; and
    the bonded assembly comprises a plurality of laterally-insulated through substrate via structures that extend through one of the first single crystalline semiconductor substrate and the second single crystalline semiconductor substrate.

* * * * *